(12) United States Patent
Ito et al.

(10) Patent No.: US 11,100,975 B2
(45) Date of Patent: Aug. 24, 2021

(54) SEMICONDUCTOR MEMORY DEVICE AND METHOD FOR ADJUSTING THRETHOLD VOLTAGE THEREOF

(71) Applicant: KIOXIA CORPORATION, Tokyo (JP)

(72) Inventors: Rui Ito, Chigasaki Kanagawa (JP); Makoto Morimoto, Yokohama Kanagawa (JP); Yutaka Shimizu, Yokohama Kanagawa (JP); Ryuichi Fujimoto, Ota Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/803,260

(22) Filed: Feb. 27, 2020

(65) Prior Publication Data

US 2021/0090633 A1    Mar. 25, 2021

(30) Foreign Application Priority Data

Sep. 19, 2019    (JP) .............................. JP2019-170926

(51) Int. Cl.
*G11C 16/34*    (2006.01)
*G11C 11/4074*    (2006.01)
(Continued)

(52) U.S. Cl.
CPC ........ *G11C 11/4074* (2013.01); *G11C 7/1012* (2013.01); *G11C 11/4076* (2013.01);
(Continued)

(58) Field of Classification Search
CPC .... G11C 16/34; G11C 7/1012; G11C 16/0483
See application file for complete search history.

(56) References Cited

U.S. PATENT DOCUMENTS 5,748,533 A    5/1998 Dunlap et al.
7,359,246 B2   4/2008 Sforzin et al.
(Continued)

FOREIGN PATENT DOCUMENTS

JP    2015-204534 A    11/2015

OTHER PUBLICATIONS

G. Naso et al., "A 128 Gb 3b/cell NAND Flash Design Using 20nm Planar-Cell Technology," ISSCC 2013/Session 12/ Non-Volatile Memory Solutions/12.5, 2013, pp. 218-220.

*Primary Examiner* — Mushfique Siddique
(74) *Attorney, Agent, or Firm* — Foley & Lardner LLP

(57) ABSTRACT

According to one embodiment, a semiconductor memory device includes a plurality of memory cells connected to a word line, a circuit configured to apply a voltage to the word line, a detection circuit configured to detect a first time difference from when a first signal of which a voltage is increased with a first slope is applied to the word line to when a current flows through the memory cells in response to applying the first signal, and a second time difference from when a second signal of which a voltage is increased with a second slope is applied to the word line to when a current flows through the memory cells in response to applying the second signal, the second slope being different from the first slope, and a determination circuit configured to determine a threshold voltage of the memory cells based on a difference between the first time difference and the second time difference.

14 Claims, 21 Drawing Sheets

(51) Int. Cl.
  *G11C 11/408*    (2006.01)
  *G11C 7/10*      (2006.01)
  *G11C 11/4076*   (2006.01)
  *G11C 16/04*     (2006.01)
  *G11C 16/26*     (2006.01)

(52) U.S. Cl.
  CPC ...... *G11C 11/4085* (2013.01); *G11C 16/0483* (2013.01); *G11C 16/26* (2013.01); *G11C 16/34* (2013.01); *G11C 16/3404* (2013.01); *G11C 16/3427* (2013.01); *G11C 16/3431* (2013.01); *G11C 16/3454* (2013.01)

(56) References Cited

U.S. PATENT DOCUMENTS

| | | | |
|---|---|---|---|
| 7,626,532 B2 | 12/2009 | Maruyama | |
| 7,782,674 B2 | 8/2010 | Roohparvar et al. | |
| 7,800,951 B2 | 9/2010 | Sutardja | |
| 7,813,181 B2 | 10/2010 | Cernea | |
| 7,944,754 B2 | 5/2011 | Cernea | |
| 7,948,802 B2 | 5/2011 | Sarin et al. | |
| 8,014,206 B2 | 9/2011 | Sutardja | |
| 8,446,786 B2 | 5/2013 | Pekny | |
| 2006/0133149 A1* | 6/2006 | Chae | G11C 5/145 365/185.18 |
| 2006/0209594 A1* | 9/2006 | Pio | G11C 11/5642 365/185.03 |
| 2010/0004885 A1* | 1/2010 | Nakanishi | B60L 3/0046 702/63 |
| 2010/0110798 A1* | 5/2010 | Hoei | G11C 16/26 365/185.24 |
| 2016/0125939 A1* | 5/2016 | Park | G11C 11/1673 365/148 |
| 2016/0267999 A1* | 9/2016 | Takeyama | G11C 29/021 |
| 2019/0295649 A1* | 9/2019 | Fujimoto | G11C 11/5628 |

* cited by examiner

—— SMALL DELAY MEMORY CELL
----- LARGE DELAY MEMORY CELL

FIG. 11

|  | BL0 | BL1 | ... | BLX-1 | BLX |
|---|---|---|---|---|---|
| FIRST RAMP WAVEFORM r1 | D1_0 | D1_1 | ... | D1_X-1 | D1_X |
| SECOND RAMP WAVEFORM r2 | D2_0 | D2_1 | ... | D2_X-1 | D2_X |
| TIME DIFFERENCE ΔT | ΔD_0 | ΔD_1 | ... | ΔD_X-1 | ΔD_X |
| (THRESHOLD VOLTAGE) | (Vth0) | (Vth1) | ... | (VthX-1) | (VthX) |

SEMICONDUCTOR MEMORY DEVICE AND METHOD FOR ADJUSTING THRETHOLD VOLTAGE THEREOF

CROSS-REFERENCE TO RELATED APPLICATION(S)

This application is based upon and claims the benefit of priority from Japanese Patent Application No. 2019-170926, filed on Sep. 19, 2019, the entire contents of which are incorporated herein by reference.

FIELD

Embodiments described herein relate generally to a semiconductor memory device and method.

BACKGROUND

A semiconductor memory device having memory cell transistors (memory cells) is known. Values of data stored in the memory cells are determined according to a threshold voltage in read processing.

When data are read from a memory, in order to determine a threshold voltage set in each memory cell, for example, in a case of a Multi-Level Cell (MLC), each of three types of reading voltages that correspond to reference threshold voltages is applied to a word line, and a sense amplifier determines whether or not a current flows.

Similarly, in a case of a Triple-Level Cell (TLC) (8-level write), a current determination by the sense amplifier shall be performed with seven types of voltages as reference threshold voltages, and in a case of a Quad-Level Cell (QLC) (16-level write), a current determination by the sense amplifier shall be performed with 15 types of voltages as reference threshold voltages.

In the case of QLC compare with TLC, data that may be stored in one memory cell increases from 3 bits to 4 bits (1.33 times increase), but the number of times of the current determination of the sense amplifier required for reading all the data increases from 7 to 15 (double or more increase). Thus, it is desirable to shorten the time for one reading.

DESCRIPTION OF THE DRAWINGS

FIG. 11 is an explanatory diagram of a data processing state of a control arithmetic unit.

DETAILED DESCRIPTION

Embodiments provide a semiconductor memory device and method capable of shortening reading time even when the number of reference threshold voltages that need to be determined increases.

In general, according to one embodiment, a semiconductor memory device includes a plurality of memory cells connected to a word line, a circuit configured to apply a voltage to the word line, a detection circuit configured to detect a first time difference from when a first signal of which a voltage is increased with a first slope is applied to the word line to when a current flows through the memory cells in response to applying the first signal, and a second time difference from when a second signal of which a voltage is increased with a second slope is applied to the word line to when a current flows through the memory cells in response to applying the second signal, the second slope being different from the first slope, and a determination circuit configured to determine a threshold voltage of the memory cells based on a difference between the first time difference and the second time difference.

Hereinafter, a semiconductor memory device and method according to embodiments will be described in detail with reference to the drawings.

[1] First Embodiment

Figure 1:
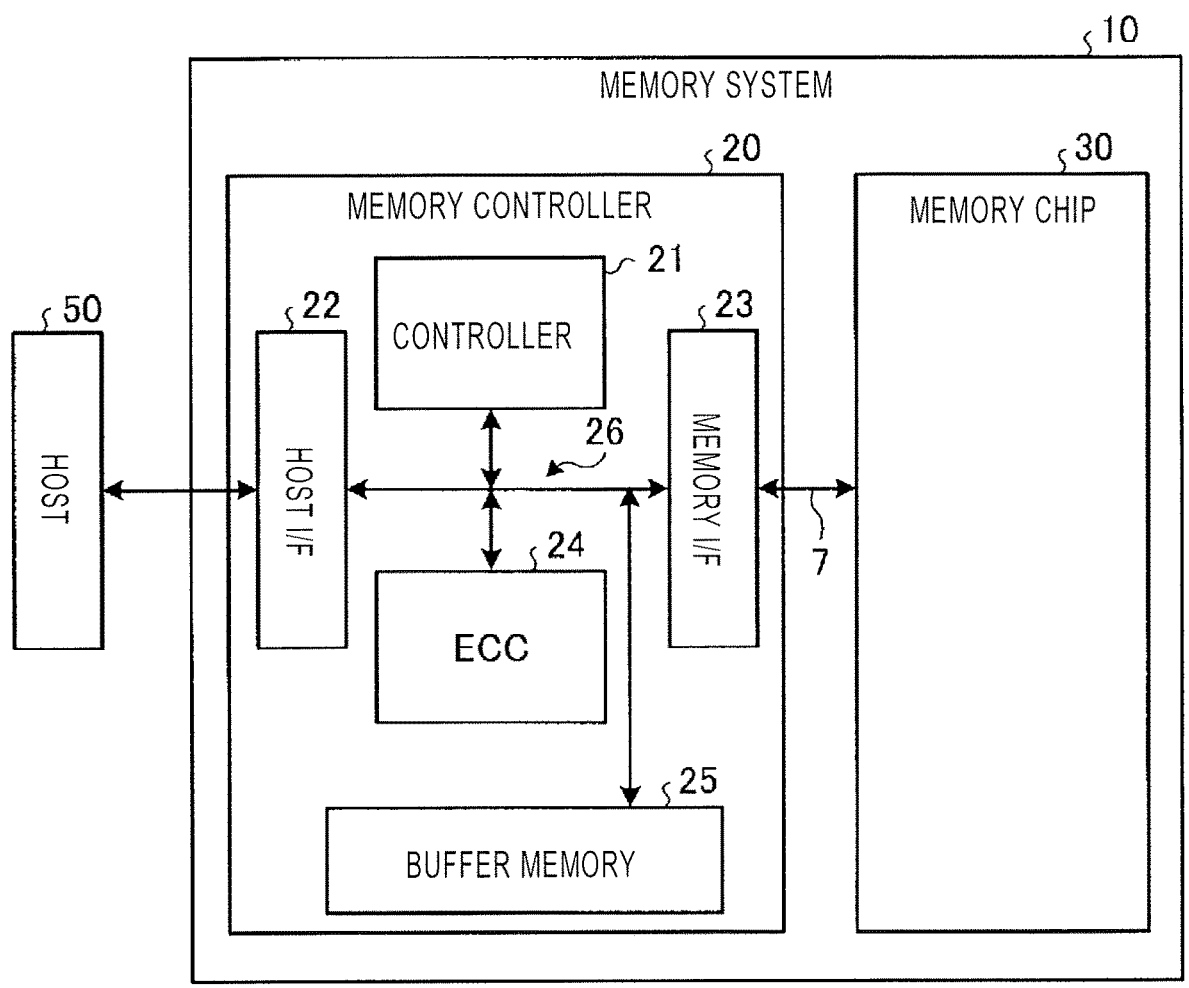
FIG. 1 is a diagram illustrating an example of a memory system including a semiconductor memory device according to a first embodiment.

FIG. 1 is a diagram illustrating an example of a memory system including a semiconductor memory device according to a first embodiment.

A memory system 10 is communicably connected to a host 50 and functions as an external storage medium for the host 50.

For example, the host 50 is configured as an information processing apparatus such as a server or a personal computer, or a mobile information processing apparatus such as a smartphone or a tablet type portable terminal.

The memory system 10 includes a memory controller 20 and a memory chip 30.

The memory controller 20 controls the memory chip 30 in response to a request (command or the like) from the host 50 or autonomously. The memory chip 30 is an example of the semiconductor memory device according to the first embodiment.

The memory controller 20 and the memory chip 30 are connected to each other by a channel 7.

The channel 7 includes a wiring group including an I/O signal lines and a control signal lines. The I/O signal lines include signal lines for transmitting/receiving, for example, data, an address or a command.

Here, the command includes a program command for instructing program processing, a read command for instructing read processing, and an erase command for instructing erase processing. The control signal lines include signal lines for transmitting and receiving, for example, a write enable signal WE, a read enable signal RE, a command latch enable signal CLE, an address latch enable signal ALE, a write protect signal WP, a data strobe signal DQS, and the like.

The memory controller 20 includes a controller 21, a host I/F (interface) 22, a memory I/F (interface) 23, an error correction circuit (ECC) 24, and a buffer memory 25, which are connected to communicate with each other via a bus 26.

In the above-described configuration, the controller 21 includes, for example, a microprocessor unit (MPU) and is a circuit that generally controls each unit in the memory controller 20.

The host I/F 22 performs a communication interface operation with the host 50.

The memory I/F 23 performs a communication interface operation with the memory chip 30 to transfer and receive addresses, data, and commands.

The ECC 24 performs an error correction process on data read from the memory chip 30.

The buffer memory 25 buffers data and instructions delivered to/from the memory chip 30 and is used as a work area by the controller 21.

Here, the memory controller 20 may include, for example, a SoC (System-On-a-Chip). Alternatively, the memory controller 20 may include a plurality of chips.

Further, the memory controller 20 may include an FPGA (Field-Programmable Gate Array) or an ASIC (Application Specific Integrated Circuit), instead of the MPU. That is, the memory controller 20 may be implemented by software, hardware, or a combination thereof.

Figure 2:
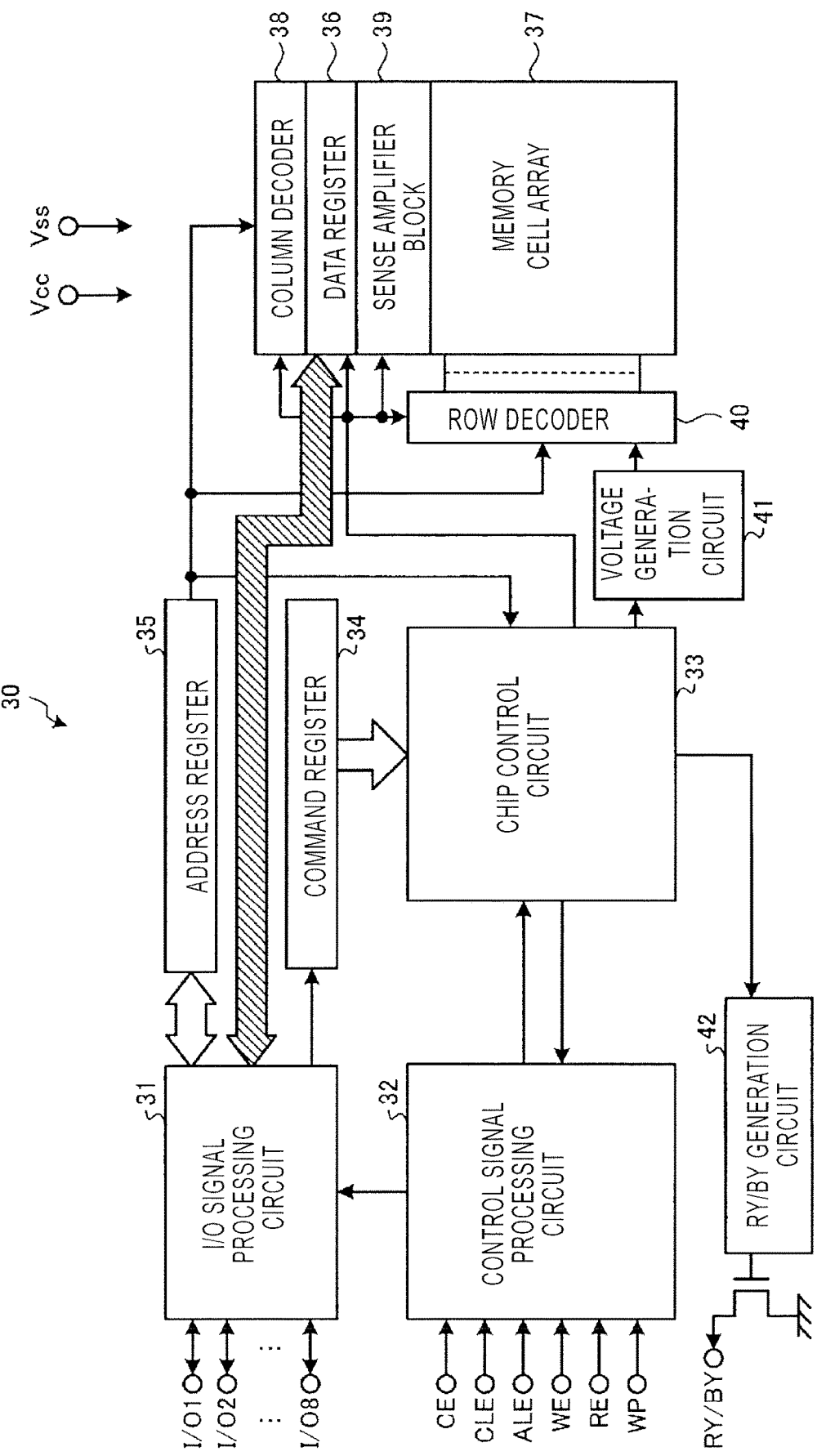
FIG. 2 is a diagram illustrating an example of a configuration of a memory chip as the semiconductor memory device according to the first embodiment.

FIG. 2 is a diagram illustrating an example of a configuration of a memory chip as the semiconductor memory device according to the first embodiment.

The memory chip 30 includes an I/O signal processing circuit 31, a control signal processing circuit 32, a chip control circuit 33, a command register 34, an address register 35, a data register 36, a memory cell array 37, a column decoder 38, a sense amplifier block 39, a row decoder 40, a voltage generation circuit 41, and an RY/BY generation circuit 42.

The I/O signal processing circuit 31 is a circuit that performs an interface operation including a buffer operation for transmitting/receiving an I/O signal with the memory controller 20 via the I/O signal lines.

The I/O signal processing circuit 31 receives a command, address, or data via the I/O signal lines, stores the command in the command register 34, stores the address in the address register 35, and stores the data in the data register 36, or reads data from the data register 36.

The control signal processing circuit 32 receives various control signals, and performs distribution of storage destination registers for the I/O signals received by the I/O signal processing circuit 31, based on the received control signals.

The chip control circuit 33 is a state machine that controls a state transition based on the various control signals received via the control signal processing circuit 32, and controls various operations of the memory chip 30. For example, the chip control circuit 33 controls an access (program processing, read processing, etc.) to the memory cell array 37 by issuing commands for controlling an operation voltage, an operation timing, and the like to the row decoder 40, the column decoder 38, the sense amplifier block 39, and the voltage generation circuit 41.

The command register 34 stores a command to be processed.

The address register 35 stores an address to be processed.

The data register 36 stores data to be processed.

Here, the memory cell array 37 and the sense amplifier block 39 will be described in detail.

Figure 3:
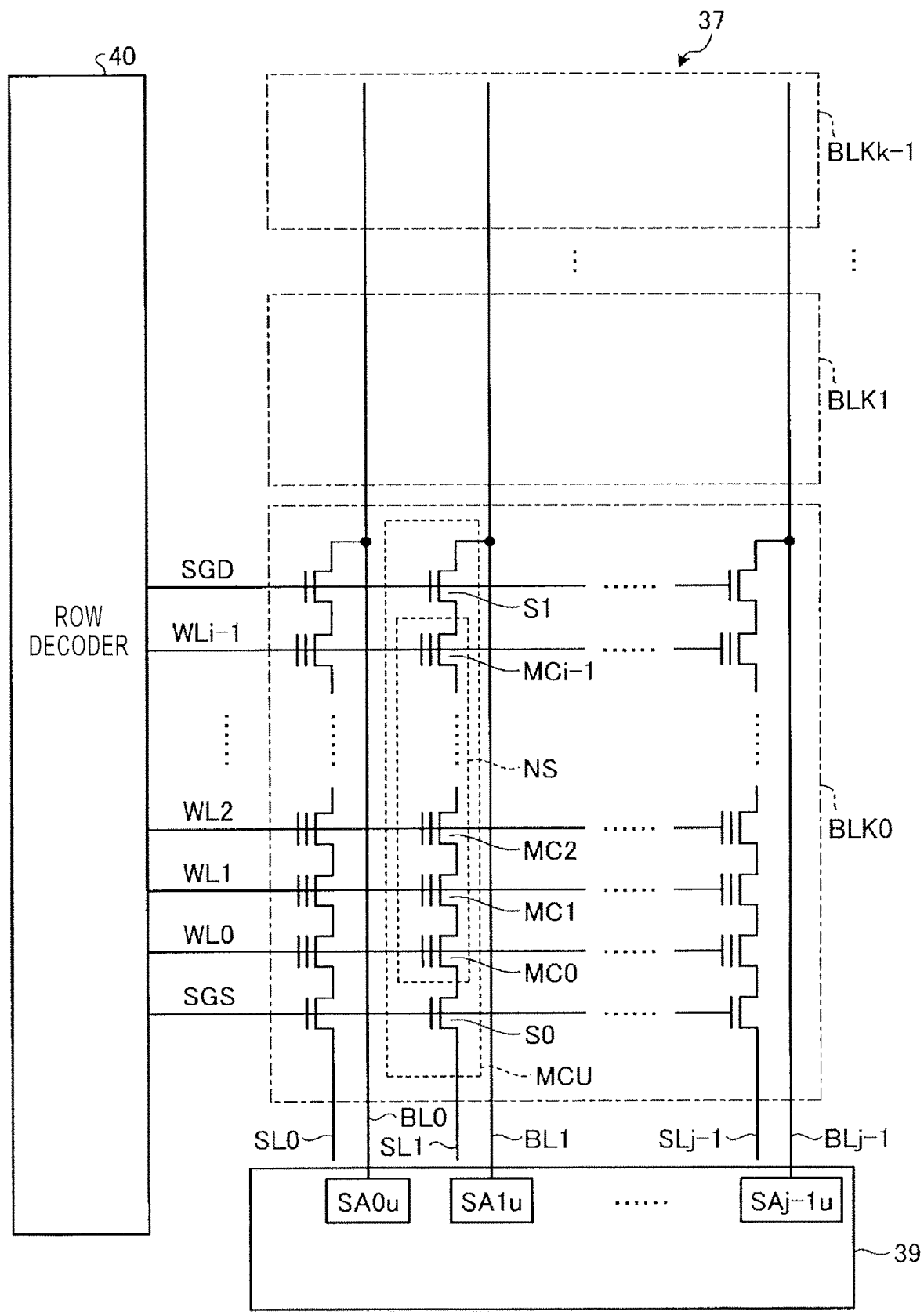
FIG. 3 is an explanatory diagram of an example of a configuration of a memory cell array and a sense amplifier block.

FIG. 3 is an explanatory diagram of an example of a configuration of the memory cell array and the sense amplifier block.

The memory cell array 37 illustrated in FIG. 3 includes k blocks BLK (BLK0 to BLKk−1). Data stored in one block BLK are erased in a batch.

Since the k blocks BLK have the same configuration, the configuration of the block BLK0 will be described below as an example.

In the block BLK0, a memory cell unit MCU includes a NAND string NS including i memory cells (memory cell transistors) MC0 to MCi−1 connected in series and select gate transistors S0 and S1 connected to both ends of the NAND string NS, respectively.

The source of the select gate transistor S0 is connected to a source line SL (SL0 to SLj−1) connected to a low-potential-side power supply line (not illustrated), and the drains of the select gate transistors S1 are connected to different bit lines BL (BL0 to BLj−1), respectively.

The sense amplifier block 39 includes j sense amplifiers (SA0$u$ to SAj−1u) corresponding to the j bit lines BL0 to BLj−1 and connected to the bit lines BL0 to BLj−1, respectively.

The gate of the select gate transistor S0 is connected to a select gate line SGS, and the gate of the select gate transistor S1 is connected to a select gate line SGD. Here, the select gate lines SGS and SGD are used for selection of a bit line.

The control gates of the memory cells MC0 to MCi−1 are connected to word lines WL (WL0 to WLi−1), respectively. That is, the control gate electrodes of the memory cells MC in the same row in the block are connected to the same word line WL.

When each memory cell MC is configured to be able to store a 1-bit value, j memory cells MC connected to the same word line WL are handled as one page, and program processing and read processing are performed for each page.

Similarly, when each memory cell MC is configured to be able to store values of a plurality of bits, for example, when each memory cell MC is able to store values of x bits (x: an integer of more than or equal to 2), the storage capacity per word line WL (storage capacity for one page) is x times the storage capacity when each memory cell MC is able to store a 1-bit value. In this case as well, program processing and read processing are performed for each page.

As illustrated in FIG. 2, the column decoder 38 selects a bit line that needs to be selected, from the bit lines BL0 to BLj−1 of the memory cell array 37, based on the address data stored in the address register 35.

The voltage generation circuit 41 is supplied with a ground voltage Vss and a power supply voltage Vcc from the outside. The voltage generation circuit 41 generates a voltage to be supplied to each circuit, based on these voltages and a command from the chip control circuit 33.

The address stored in the address register 35 includes a row address and a column address. The row address is transferred and stored in the row decoder 40, and the column address is transferred and stored in the column decoder 38.

In the program processing, the row decoder 40 selects a word line WL based on the row address. Meanwhile, the column decoder 38 selects a bit line BL based on the column address.

As a result, a programming pulse is applied to a select target memory cell MC (referred to as a memory cell MCsel) located at the intersection of a word line WL selected by the row decoder 40 (referred to as a word line WLsel) and a bit line BL selected by the column decoder 38 (referred to as a bit line BLsel), from the word line WLsel via the row decoder 40.

By the application of the programming pulse, for example, in a case of QLC type storing a 4-bit value in one memory cell MC, the threshold voltage of the memory cell MCsel is set to a state according to the data stored in the data register 36 among 16 states.

Here, an example of the relationship between a state and a threshold voltage will be described.

Figure 4:
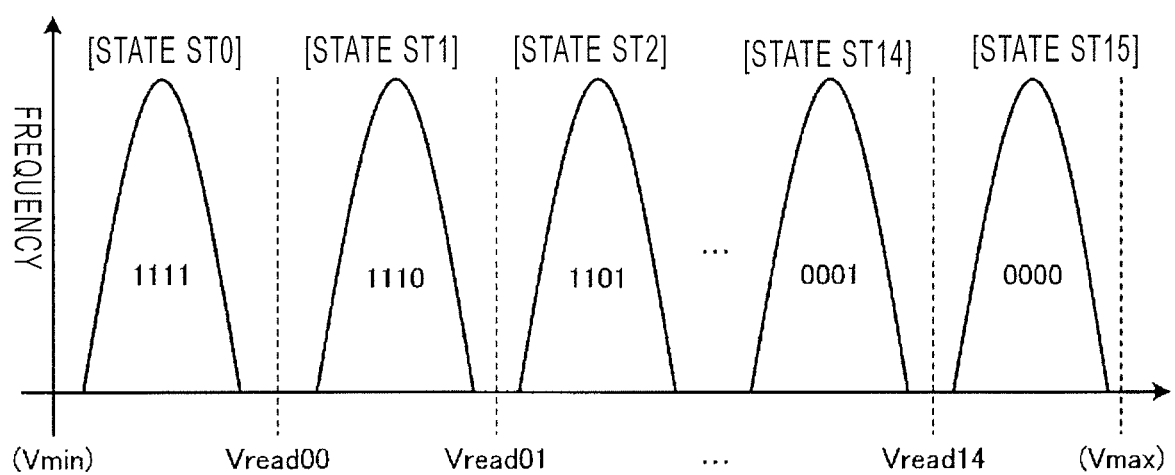
FIG. 4 is a diagram for illustrating an example of a configuration of a QLC type threshold voltage.

FIG. 4 is a diagram for illustrating an example of a configuration of a threshold voltage in the QLC type.

In FIG. 4, the vertical axis represents the (detection) frequency of a threshold voltage of a memory cell, and the horizontal axis represents a threshold voltage.

The range in which the threshold voltage is controlled (the range of V min to V max in FIG. 4) is divided into 16 states (small regions) ST0 to ST15. The states ST0 to ST15 are associated with different 4-bit values.

Specifically, in the example of FIG. 4, the 16 small regions ST0 to ST15 are associated with 4-bit values (data) of "1111," "1110," "1101," "1100," "1011," "1010," "1001," "1000," "0111," "0110," "0101," "0100," "0011," "0010," "0001," and "0000," respectively, from the low voltage side.

In the program processing, the threshold voltage of a memory cell MC to be programmed is controlled so as to belong to a state corresponding to data to be programmed among the 16 states ST0 to ST15. As a result, in a page or block after the programming, the frequency of the threshold voltage of the memory cell MC (the frequency of appearance of the memory cell with respect to the threshold voltage) is formed with 16 mountain-shaped distributions illustrated in FIG. 4.

In addition, the correspondence between the state and the data is not limited to the example illustrated in FIG. 4. Further, in the example of FIG. 4, the range in which the threshold voltage is controlled (the range of V min to V max) is set from a negative region to a positive region. The setting of the range in which the threshold voltage is controlled is not limited thereto. For example, the range in which the threshold voltage is controlled may be set only in the positive region.

Next, the outline of the data read processing will be described.

In the data read processing, first, as in the program processing, a word line WLsel and a bit line BLsel are selected based on a row address and a column address. A determination voltage is applied via the row decoder 40 from the word line WLsel to a memory cell MCsel located at the intersection of the word line WLsel and the bit line BLsel. The sense amplifier block 39 determines data by detecting a state change of the memory cell MCsel according to the determination voltage, and stores the determination result (data) in the data register 36.

The data stored in the data register 36 is sent to the I/O signal processing circuit 31 through a data line and transferred from the I/O signal processing circuit 31 to the memory controller 20.

In the data read processing, data is determined based on the voltage relationship between the threshold voltage of each memory cell MC and read threshold voltages Vread00 to Vread14 corresponding to the states ST0 to ST15 illustrated in FIG. 4, respectively.

That is, data corresponding to a state to which the threshold voltage of a memory cell MC corresponding to the programmed data belongs is determined.

For example, in the example of FIG. 4, when the threshold voltage of a memory cell MC to be read is between the read threshold voltage Vread00 and the read threshold voltage Vread01, it is determined that the programmed data of the memory cell MC is "1110."

Next, a principle of the data read processing of the first embodiment will be described.

In the first embodiment, in the read processing corresponding to any one selected word line WLsel, each of two types of determination voltages having ramp waveforms with different slopes is applied to the word line WLsel, to perform reading twice. As a result, it is possible to perform reading that cancels the influence of the effective length of the word line WLsel from a driver constituting the row decoder 40 to a memory cell MCsel to be read.

Figure 5:
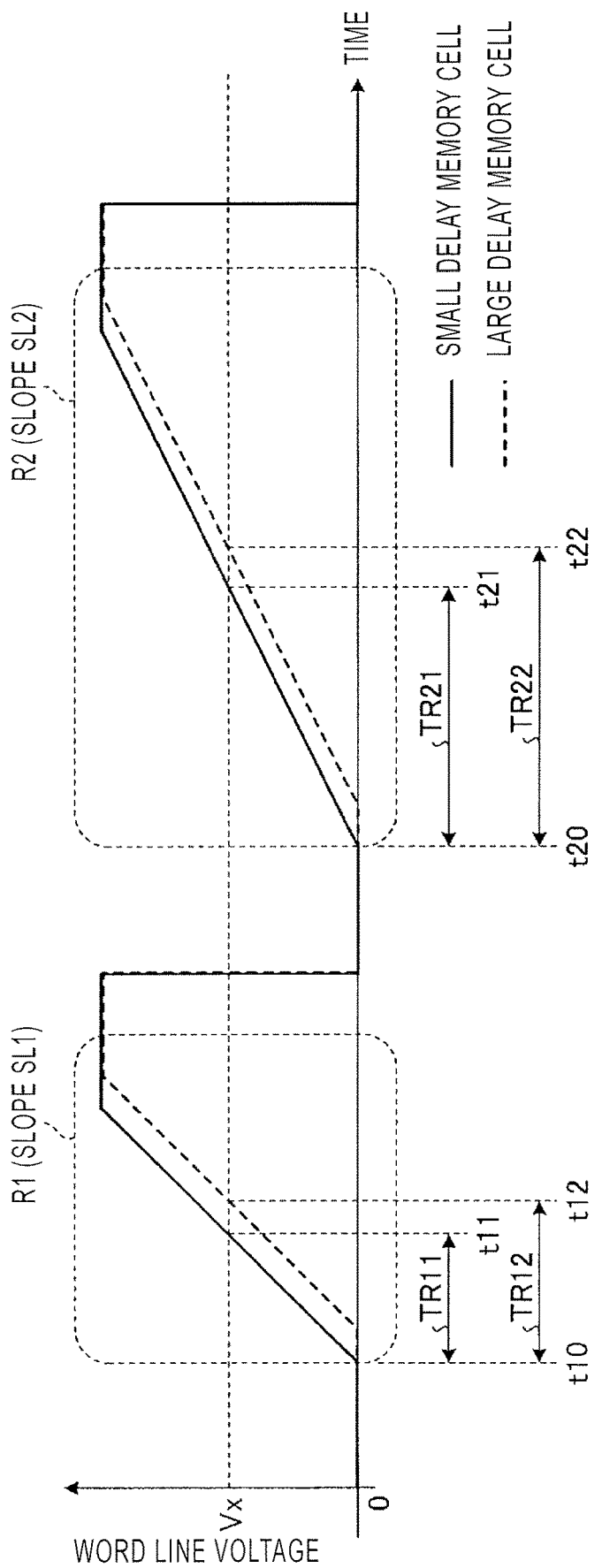
FIG. 5 is a diagram (part 1) for illustrating a principle of data read processing according to the first embodiment.

FIG. 5 is a diagram (part 1) for illustrating the principle of the data read processing according to the first embodiment.

When a first ramp waveform R1 (slope SL1) is input and when a second ramp waveform R2 (slope SL2<SL1) is input to the same memory cell MC, a time period between a time when a ramp waveform starts to be input to the word line of the memory cell MC (application of a determination voltage) and a time when the word line voltage starts to rise until the word line voltage reaches the same voltage Vx differs. In this case, naturally, the time for which the second ramp waveform R2 having the smaller slope is input (applied) is relatively longer than the time period for which the first ramp waveform R1 is applied. In addition, as long as there is no electrical delay element, a timing when the word line voltage starts to rise may be substantially the same as a timing when the input of the first ramp waveform R1 or the second ramp waveform R2 is started.

For example, an example in which there is almost no electrical delay element between the driver and the memory cell MCsel to be read will be described. When the first ramp waveform R1 is input, as indicated by a solid line in FIG. 5, the time from a timing (=t10) at which the application of the determination voltage to the word line WLsel of the memory cell MCsel to be read is started to a timing (=t11) at which the word line voltage reaches the voltage Vx is time TR11 (=t11−t10).

Meanwhile, when the second ramp waveform R2 is input, as indicated by a solid line in FIG. 5, it may be seen that the time TR21 (=t21−t20) from a timing (=t20) at which the application of the determination voltage to the word line WLsel of the memory cell MCsel to be read is started to a timing (=t21) at which the word line voltage reaches the voltage Vx is longer than the time when the first ramp waveform R1 is input.

Here, descriptions will be made on a case where the same ramp waveform is input to two memory cells MC having different effective word line lengths from the driver constituting the row decoder 40. That is, when the same ramp waveform is input to a memory cell MC with a short effective word line length from the driver and a small delay (hereinafter, referred to as a small delay memory cell MC) and a memory cell MC with a long effective word line length from the driver and a large delay (hereinafter, referred to as a large delay memory cell MC), the time from when the application of the determination voltage to the word line WL of the memory cell MC is started to when the word line voltage reaches the same voltage Vx (hereinafter, referred to as voltage arrival time) differs, and naturally, the time for the small delay memory cell MC is relatively shorter.

More specifically, as an example, when the first ramp waveform R1 is input to the small delay memory cell MC and the application of the determination voltage to the word line WL is started from timing t10, as indicated by a solid line in FIG. 5, the voltage arrival time of the small memory cell MC is time TR11.

Meanwhile, when the first ramp waveform R1 is input to the large delay memory cell MC and the application of the determination voltage to the word line WL is started from timing t10, as indicated by a broken line in FIG. 5, the determination voltage starts to rise with a delay in the large delay memory cell MC, and the voltage arrival time is time TR12 (=t12−t10>TR11).

Similarly, as an example, when the second ramp waveform R2 is input to the small delay memory cell MC and the application of the determination voltage to the word line WL is started from timing t20, as indicated by a solid line in FIG. 5, the voltage arrival time of the small delay memory cell MC is time TR21.

Meanwhile, when the second ramp waveform R2 is input to the large delay memory cell MC and the application of the determination voltage to the word line WL is started from timing t20, as indicated by a broken line in FIG. 5, the determination voltage starts to rise with a delay in the large delay memory cell MC, and the voltage arrival time is time TR22 (=t22−t20>TR21).

That is, the time from when the application of the determination voltage to the word line WL is started to when the word line voltage reaches the voltage Vx varies depending on the word line length.

Figure 6:
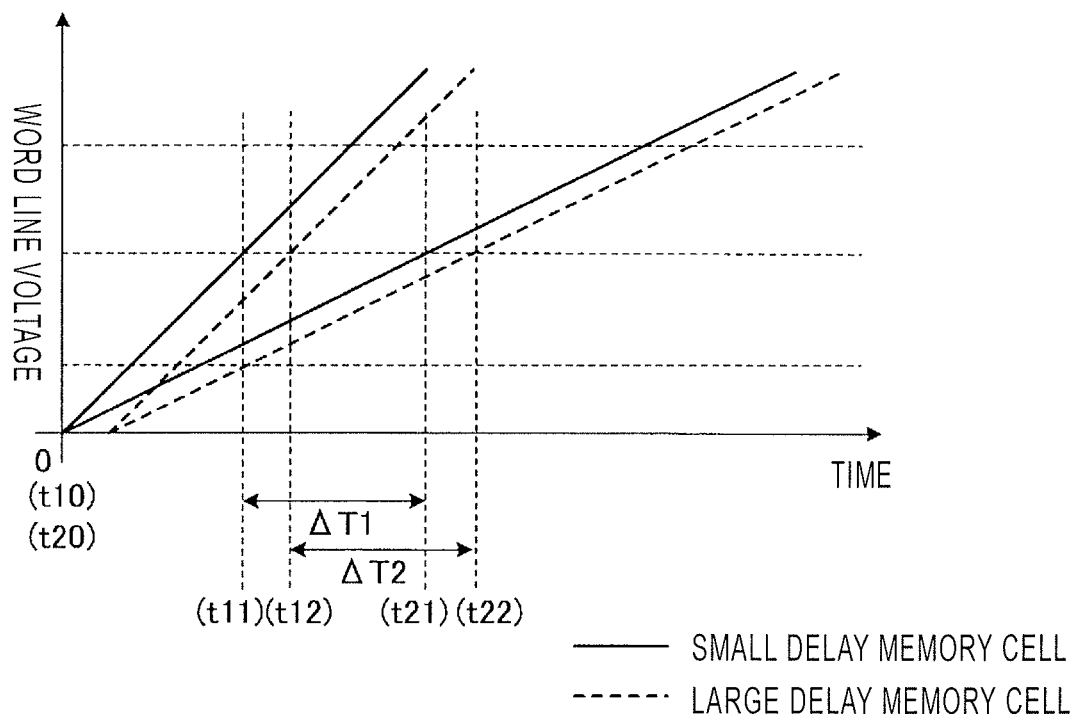
FIG. 6 is a diagram (part 2) for illustrating the principle of data read processing according to the first embodiment.

FIG. 6 is a diagram (part 2) for illustrating the principle of the data read processing according to the first embodiment.

However, it has been understood that for the same memory cell MC, when a difference between the time from when the first ramp waveform R1 is input to when the word line voltage reaches the voltage Vx and the time from when the second ramp waveform R2 is input to when the word line voltage reaches to the voltage Vx is obtained, the time difference is constant regardless of whether the memory cell MC is a memory cell with a short effective word line length from the driver and a small delay or a memory cell with a long effective word line length from the driver and a large delay.

That is, a time difference $\Delta T1$ obtained by subtracting time TR11 from time TR21 for a memory cell MC having a characteristic indicated by a solid line in FIG. 5 (small delay memory cell MC) and a time difference $\Delta T2$ obtained by subtracting time TR12 from time TR22 for a memory cell MC having a characteristic indicated by a broken line in FIG. 5 (large delay memory cell MC) are considered not to fluctuate significantly within the time period in which the ramp waveform is given twice. Therefore, it may be considered that the time difference $\Delta T1$ and the time difference $\Delta T2$ are equal to each other ($\Delta T1=\Delta T2$).

By the way, the time differences $\Delta T1$ and $\Delta T2$ are obtained by using two ramp waveforms R1 and R2 having different slopes. Therefore, when a threshold voltage (=corresponding word line voltage) corresponding to data programmed in the memory cell MC for obtaining the time differences $\Delta T1$ and $\Delta T2$ is high, the time differences $\Delta T1$ and $\Delta T2$ increase and become long. When the threshold voltage (=corresponding word line voltage) corresponding to the data programmed in the memory cell MC is low, the time differences $\Delta T1$ and $\Delta T2$ decrease and become short.

Therefore, when the relationship between the time differences $\Delta T1$ and $\Delta T2$ and the threshold voltage is known in advance for a semiconductor device to be determined, the threshold voltage may be determined using the time differences $\Delta T1$ and $\Delta T2$.

Therefore, a simulation was performed to confirm that this principle is correct.

Figure 7:
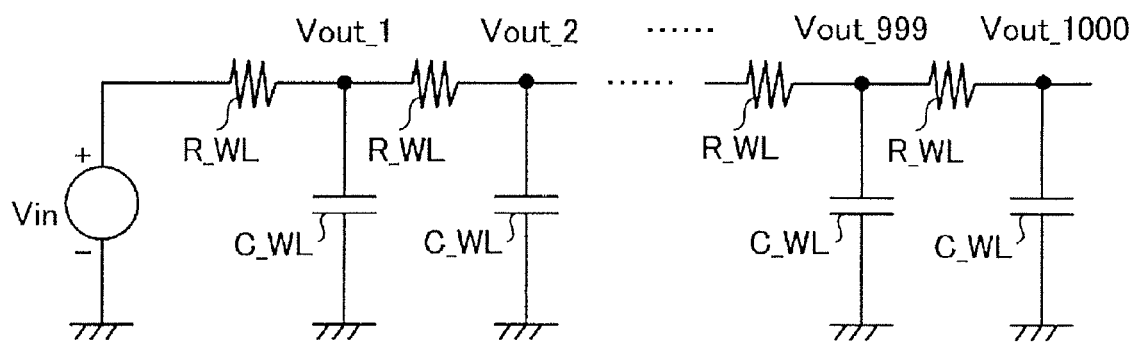
FIG. 7 is an equivalent circuit of memory cells connected to the same word line.

FIG. 7 is an equivalent circuit of memory cells connected to the same word line.

Each memory cell MC may be represented as a combination of a resistor R_WL and a capacitor C_WL, and connection points of the resistor R_WL and the capacitor C_WL are represented as output voltage nodes Vout_1 to Vout_1000. That is, the equivalent circuit of FIG. 7 corresponds to an example in which 1000 memory cells are connected to the same word line.

Figure 8:
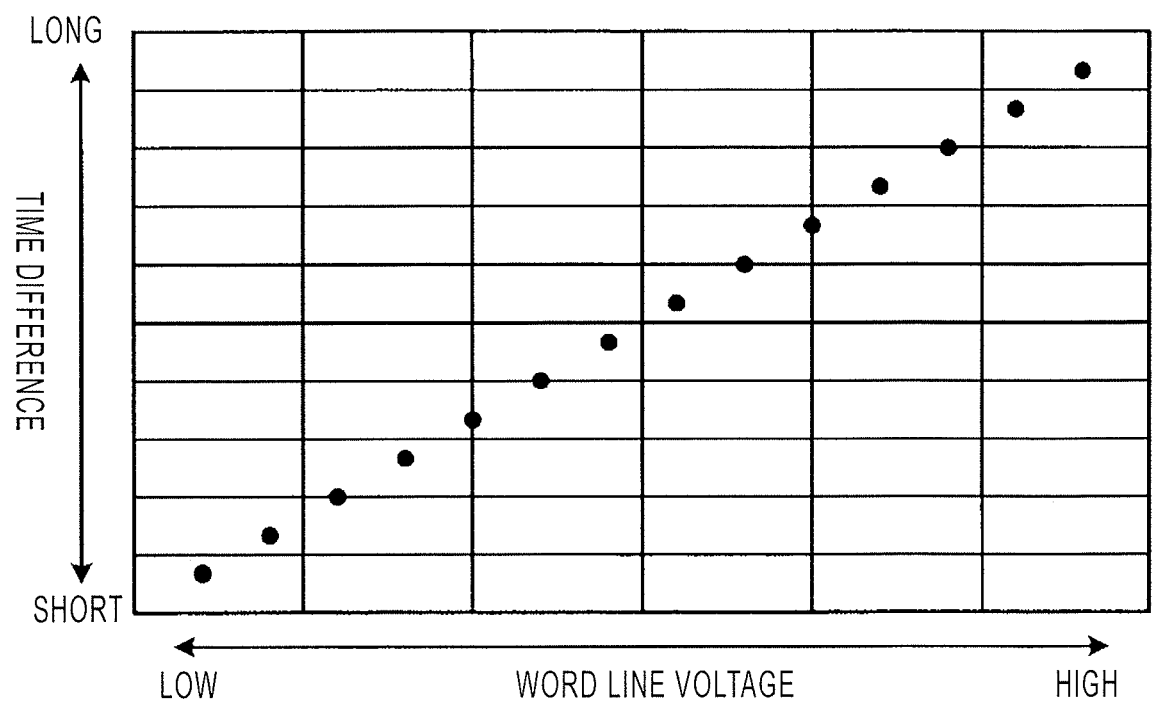
FIG. 8 is a diagram illustrating a simulation result of a time difference obtained using two ramp waveforms having different word line voltages for all output voltage nodes.

FIG. 8 is a diagram illustrating a simulation result of a time difference obtained using two ramp waveforms having different word line voltages for all output voltage nodes.

FIG. 8 is a plot in which the output voltages of the output voltage nodes Vout_1 to Vout_1000 are plotted on the horizontal axis and a time difference at that time (corresponding to the above-described time differences $\Delta T1$ and $\Delta T2$) is plotted on the vertical axis.

In FIG. 8, each plot looks like one, but the time difference corresponding to all of the output voltage nodes Vout_1 to Vout_1000 is plotted for each word line voltage.

That is, it may be seen that all memory cells have the same characteristics and a time difference corresponding to the word line voltage is obtained.

In addition, FIG. 8 is merely an example, and a variation differs according to the value of the simulated load on the word line and the slope of the two ramp waveforms.

Next, prior to description on the operation of the first embodiment, an example of a specific configuration of a memory cell read circuit will be described.

Figure 9:
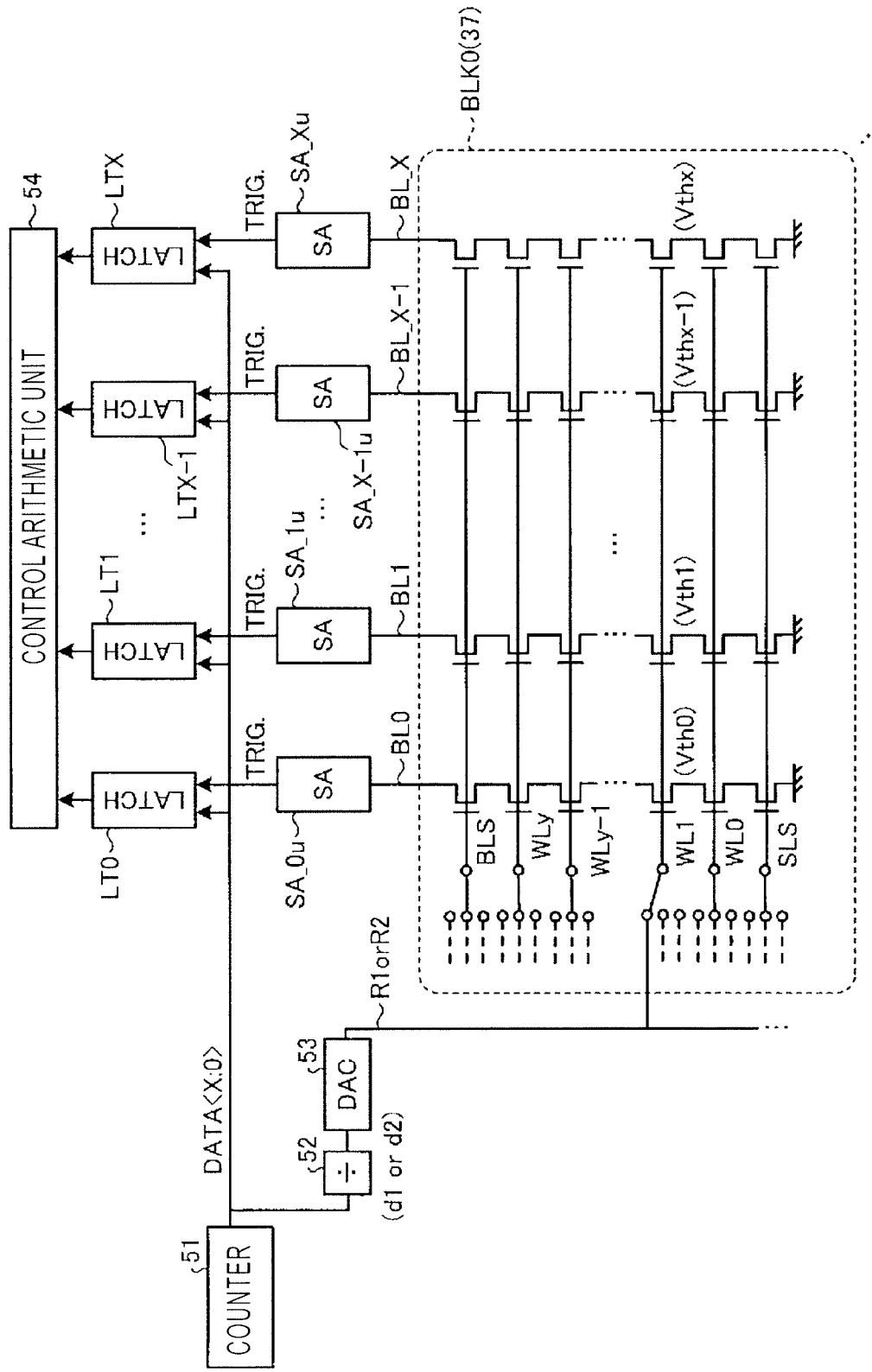
FIG. 9 is an explanatory diagram of an example of a configuration of a part of a memory chip.

FIG. 9 is an explanatory diagram of an example of a configuration of a part of a memory chip.

The memory chip 30 includes a counter 51 that counts up a count value for measuring time from the start of application of the determination voltage to the word line WL to the start of flow of a current through the memory cell MC during the read processing of the memory cell MC, a divider 52 that divides the count value (dividend) by a predetermined first divisor value d1 corresponding to the slope of the first ramp waveform R1 or a predetermined second divisor value d2 corresponding to the slope of the second ramp waveform R2, a digital/analog converter (DAC) 53 that performs a digital/analog conversion of the division result of the divider 52 and outputs the first ramp waveform R1 or the second ramp waveform R2, (X+1) sense amplifiers (SA) SA0u to SAXu that correspond to first bit line BL0 to X-th bit line BLX, respectively, and output a trigger signal TRIG when a current is detected, (X+1) latch circuits LT0 to LTX that latch the count value of the counter 51 at the input timing of the trigger signal TRIG from the corresponding sense amplifiers (SA) SA0u to SAXu, and a control arithmetic unit 54 that controls the respective units and calculates a time difference (corresponding to the above-described ΔT1 and ΔT2) based on the output of the latch circuits LT0 to LTX.

In the above-described configuration, since the calculated time difference corresponds to the threshold voltage of each memory cell MC, the control arithmetic unit 54 may use the calculated time difference as it is for control or may convert the calculated time difference into the threshold voltage of each memory cell MC and use the threshold voltage for control.

Next, the operation of the first embodiment will be described.

In the following description, the operation in the first bit line BL0 will be mainly described for the purpose of easy understanding and simplification of description. The other bit lines BL1 to BLX have the same operation as the first bit line BL0.

Figure 10A:
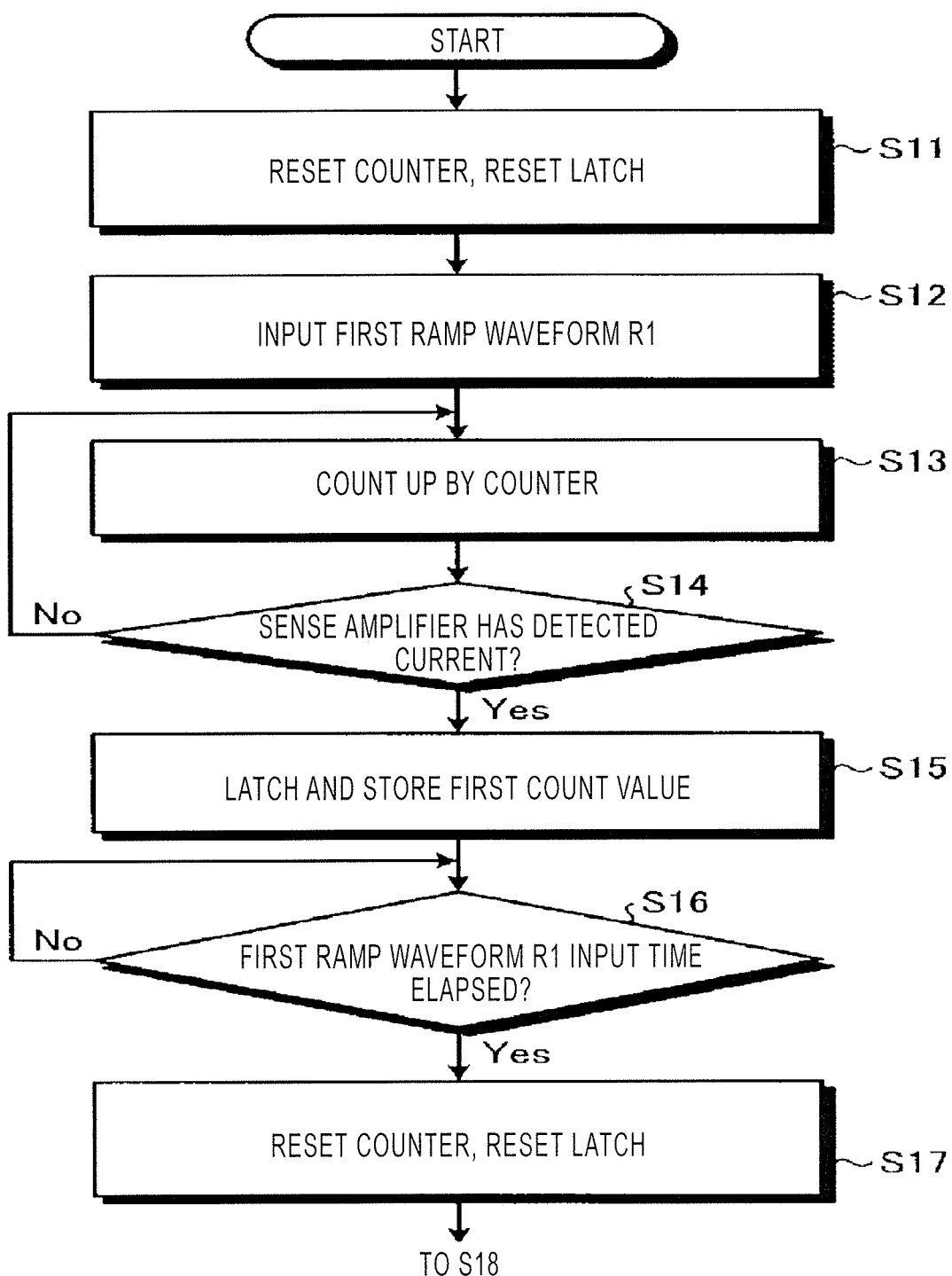
FIGS. 10A and 10B are flowcharts of a processing for each bit line according to the first embodiment.
Figure 10B:
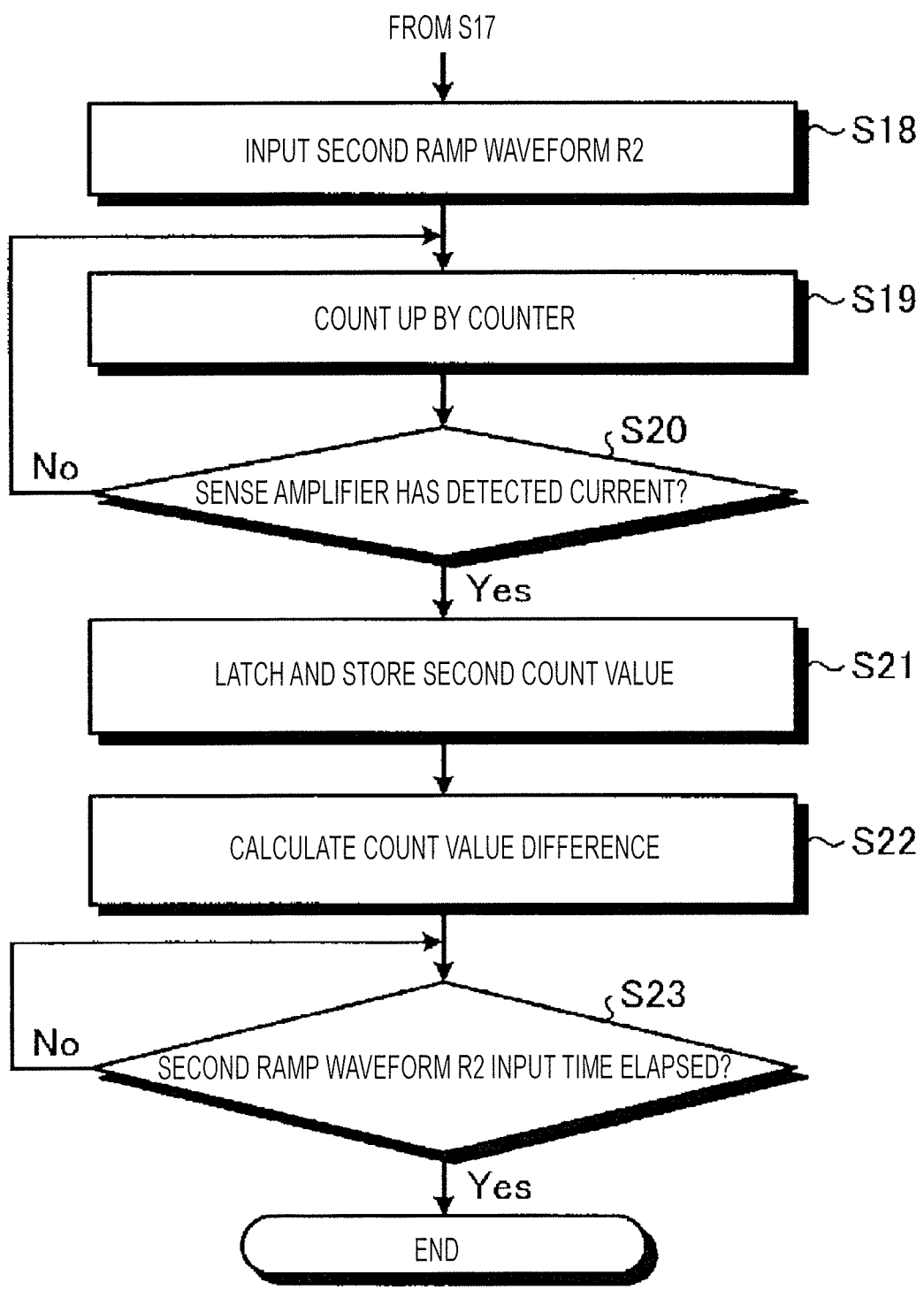

FIGS. 10A and 10B are flowcharts of a processing for each bit line according to the first embodiment.

In this case, it is assumed that the word line WL1 is currently selected.

First, the control arithmetic unit 54 controls the counter 51 and the latch circuits LT0 to LTX to reset the count value of the counter 51 and reset the latch circuits LT0 to LTX (S11).

Subsequently, the control arithmetic unit 54 controls the counter 51 to start counting up and controls the divider 52 to divide the input count value by the first divisor value d1. Thus, the divider 52 divides the count value output by the counter 51 by the first divisor value d1 and outputs the division result to the digital/analog converter 53.

As a result, the first ramp waveform R1 having a first slope is input to the currently selected word line WL1 by the digital/analog converter 53 (S12).

In this state, the counter 51 continues the counting up (S13).

Meanwhile, the latch circuits LT0 to LTX determine whether or not the corresponding sense amplifiers SA0u to SAXu have detected a current, based on presence/absence of input of the trigger signal TRIG (S14).

When it is determined in step S14 that the corresponding sense amplifiers have not yet output the trigger signal TRIG (No in S14), the latch circuits LT0 to LTX move the process to step S13 and enter a standby state.

For example, when it is determined in step S14 that the corresponding sense amplifier SA0u has output the trigger signal TRIG (Yes in S14), the latch circuit LT0 latches a first count value corresponding to the first ramp waveform R1, and the control arithmetic unit 54 stores the first count value of the latch circuit LT0 for calculation (S15).

FIG. 11 is an explanatory diagram of a data processing state of the control arithmetic unit.

Specifically, at a timing at which the sense amplifier SA0u corresponding to the latch circuit LT0 outputs the trigger signal TRIG, when the count value output by the counter 51 is D1_0, the control arithmetic unit 54 stores the count value=D1_0 as a count value of the first bit line BL0 when the first ramp waveform R1 is input, as illustrated in FIG. 11.

Returning to FIG. 10A, subsequently, the control arithmetic unit 54 determines whether or not the input time of the first ramp waveform R1, that is, the time until the voltage of the first ramp waveform R1 reaches a predetermined upper limit voltage from an initial value (e.g., 0V), has elapsed (S16).

When it is determined in step S16 that the input time of the first ramp waveform R1, that is, the time until the voltage of the first ramp waveform R1 reaches the predetermined upper limit voltage from the initial value (e.g., 0V), has not yet elapsed (No in S16), since there may be a latch circuit that has not yet latched data, the control arithmetic unit 54 enters a standby state.

When it is determined in step S16 that the input time of the first ramp waveform R1, that is, the time until the voltage of the first ramp waveform R1 reaches the predetermined upper limit voltage, has elapsed (Yes in S16), it may be considered that all the latch circuits have latched data. Here, by storing the initial value at the time of resetting the latch circuits LT0 to LTX at a value corresponding to a memory cell MC of an erase level, it is regarded that a latch circuit corresponding to the memory cell MC of the erase level has latched a reset value. Accordingly, the control arithmetic unit 54 controls the counter 51 and the latch circuits LT0 to LTX to reset the count value of the counter 51 and to reset the latch circuits LT0 to LTX (S17).

In addition, for the memory cell of the erase level, the latch circuits may latch data collectively at the point of time when the input time of the first ramp waveform R1, that is, the time until the voltage of the first ramp waveform R1 reaches the predetermined upper limit voltage, has elapsed.

Subsequently, the control arithmetic unit 54 controls the counter 51 to start counting up and controls the divider 52 to divide the input count value by the second divisor value d2. Thus, the divider 52 divides the count value output by the counter 51 by the second divisor value d2 and outputs the division result to the digital/analog converter 53.

As a result, the second ramp waveform R2 having the second slope is input to the currently selected word line WL1 by the digital/analog converter 53 (S18).

In this state, the counter 51 continues the counting up (S19).

Meanwhile, the latch circuits LT0 to LTX determine whether or not the corresponding sense amplifiers SA0u to SAXu have detected a current, based on presence/absence of input of the trigger signal TRIG (S20).

When it is determined in step S20 that the corresponding sense amplifiers have not yet output the trigger signal TRIG (No in S20), the latch circuits LT0 to LTX move the process to step S19 and enter a standby state.

For example, when it is determined in step S20 that the corresponding sense amplifier SA0u has output the trigger signal TRIG (Yes in S20), the latch circuit LT0 latches the second count value corresponding to the second ramp waveform R2, and the control arithmetic unit 54 stores the second count value of the latch circuit LT0 for calculation (S21).

Specifically, at a timing at which the sense amplifier SA0u corresponding to the latch circuit LT0 outputs the trigger signal TRIG, when the count value output by the counter 51 is D2_0, the control arithmetic unit 54 stores the count value=D2_0 as a count value of the first bit line BL0 when the second ramp waveform R2 is input, as illustrated in FIG. 11.

Subsequently, the control arithmetic unit 54 reads out the count value=D1_0 when the first ramp waveform R1 stored in step S15 is input and the count value=D2_0 when the second ramp waveform R2 stored in step S21 is input, and calculates a count value difference corresponding to the time difference ΔT (S22).

Specifically, in the above-described example, ΔD_0=D2_0−D1_0.

Subsequently, the control arithmetic unit 54 determines whether or not the input time of the second ramp waveform R2, that is, the time until the voltage of the second ramp waveform R2 reaches a predetermined upper limit voltage from an initial value (e.g., 0V), has elapsed (S23).

When it is determined in step S23 that the input time of the second ramp waveform R2, that is, the time until the voltage of the second ramp waveform R2 reaches the predetermined upper limit voltage from the initial value, has not yet elapsed (No in S23), since there may be a latch circuit that has not yet latched data and there may still be memory cell MC of a bit line for which the count value difference has not been calculated, the control arithmetic unit 54 enters a standby state.

When it is determined in step S23 that the input time of the second ramp waveform R2, that is, the time until the voltage of the second ramp waveform R2 reaches the predetermined upper limit voltage from the initial value, has elapsed (Yes in S23), it may be considered that all the latch circuits have latched data and all the count value differences have been calculated. Here, by storing the initial value at the time of resetting the latch circuits LT0 to LTX at a value corresponding to a memory cell MC of an erase level, it is regarded that a latch circuit corresponding to the memory cell MC of the erase level has latched a reset value. Accordingly, the control arithmetic unit 54 ends the process. In addition, the control arithmetic unit 54 may interchange step S22 and step S23 and perform the calculation of the count value difference collectively after completing the input time of the second ramp waveform R2.

As a result, the count values D1_0 to D1_X when the first ramp waveform R1 is input and the count values D2_0 to D2_X when the second ramp waveform R2 is input are acquired, and the count value differences ΔD_1 to ΔD_X corresponding to the time difference ΔT based on these values are calculated.

As a result, it is determined whether or not a threshold voltage corresponding to the programmed data of each memory cell MC connected to a selected word line belongs to any state (state ST0 to state ST15 in the example of FIG. 4), and a process for obtaining the corresponding stored value (0000 to 1111) is performed.

The above description relates to a case where data is read from a memory cell MC, but the embodiment may also be applied to a case where a verify is performed in the same way.

As described above, according to the first embodiment, in the read processing in a semiconductor memory device (e.g., NAND flash memory) that performs multi-value storage such as TLC, QLC, etc., since the threshold voltage corresponding to the programmed data may be specified without waiting until the voltage of each memory cell is stabilized, it is possible to provide a semiconductor memory device capable of performing processing at a high speed by reducing the time required for reading or verifying.

In the above description, the input order of the ramp waveforms is the first ramp waveform R1→the second ramp waveform R2, but the same result may be obtained even when the input order is the second ramp waveform R2→the first ramp waveform R1 (a waveform having a small slope→a waveform having a large slope).

As described above, by inputting determination voltages having two ramp waveforms R1 and R2 having different slopes to the same word line and measuring for each memory cell MC the time from the start of voltage application to the arrival at the threshold voltage corresponding to the data programmed in each memory cell MC to calculate a time difference, the effect of the effective word line length of each memory cell MC may be cancelled to obtain a time proportional to the threshold voltage corresponding to the data programmed in each memory cell MC, and the effect of the effective length (line length) of the word line WL reaching a memory cell MC to be read is cancelled to determine the threshold voltage.

Further, according to the first embodiment, the number of times of current determination of the sense amplifier required for reading all data is only once for each memory cell, thereby shortening the effective data read time.

[2] Second Embodiment

In the first embodiment, the two ramp waveforms R1 and R2 having different slopes are used to read data from a memory cell. A second embodiment involves a case of using a step waveform (rectangular waveform), instead of the ramp waveform R1 in the first embodiment.

In this case, the step waveform may be considered as a waveform obtained by increasing the slope of the ramp waveform R1 nearly infinitely, and a threshold voltage corresponding to the programmed data may be specified by the same principle as in the first embodiment.

Figure 12:
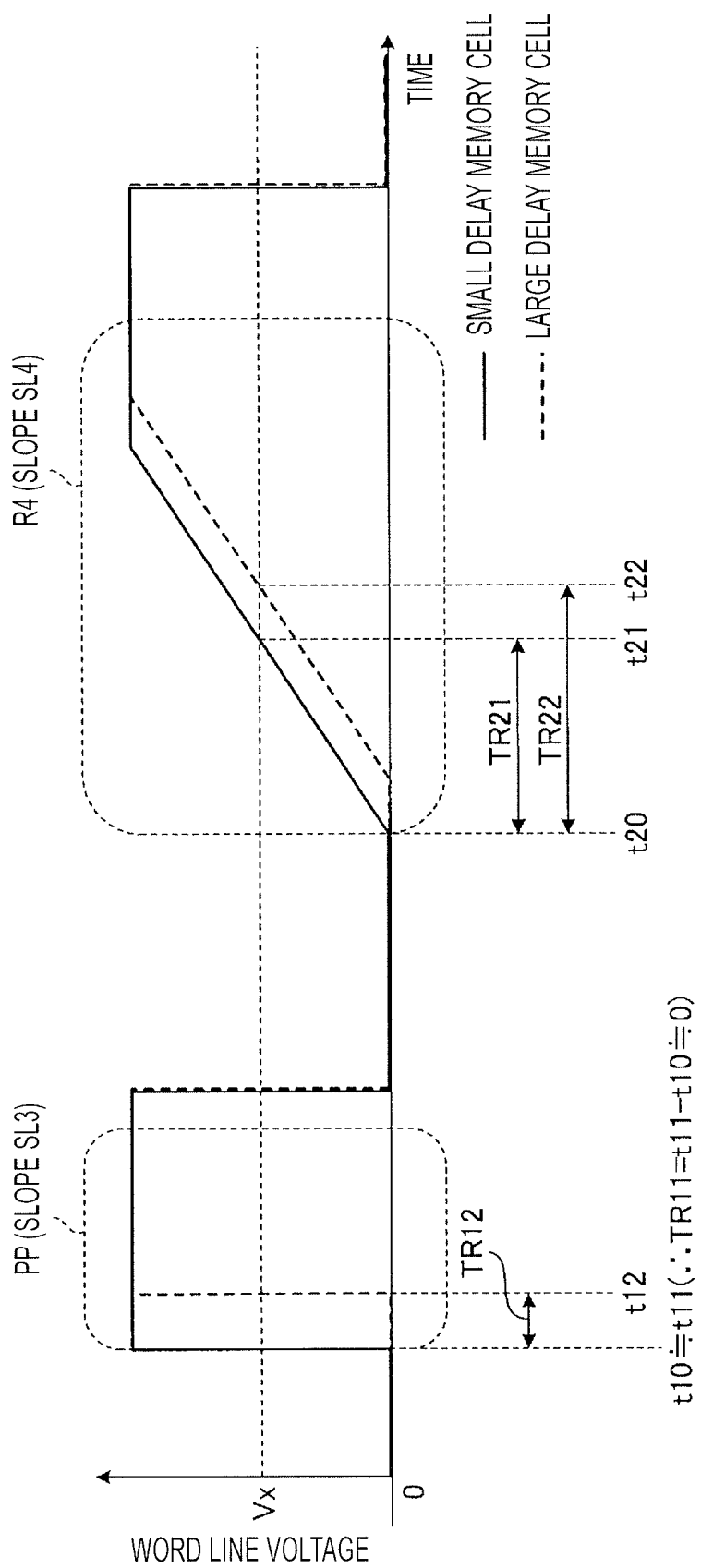
FIG. 12 is a diagram (part 1) for illustrating a principle of data read processing according to a second embodiment.

FIG. 12 is a diagram (part 1) for illustrating the principle of data read processing according to the second embodiment.

When a step waveform PP (slope SL3=∞) is input and when a ramp waveform R4 (slope SL4<<SL3) is input to the same memory cell MC, the time from the timing when each waveform starts to be input to the word line of the memory cell MC and the word line voltage starts to rise until the voltage rises and reaches the same voltage Vx differs. In this case, naturally, the time when the ramp waveform R4 having a smaller slope is input is relatively longer. In addition, the timing when the word line voltage starts to rise is substantially the same as the timing when the input of the step waveform PP or the ramp waveform R4 is started.

In addition, when the same waveform is input to two memory cells MC having different effective word line lengths from the driver constituting the row decoder 40, that is, when the same waveform is input to a memory cell MC having a short effective word line length from the driver and a small delay and a memory cell MC having a long effective word line length from the driver and a large delay, the time until the word line voltage reaches the same voltage Vx differs. In this case, naturally, the time of the memory cell MC having a short effective word line length from the driver and a small delay becomes relatively shorter.

This will be specifically described below.

When the step waveform PP is input, as indicated by a solid line in FIG. 12, the time from a timing (=t10) at which the word line voltage of the memory cell MC to be read starts to rise to a timing (=t11) at which the word line voltage reaches the voltage Vx is time TR11 (=t11−t10)≈0 since the timing t10≈the timing t11.

Meanwhile, when the ramp waveform R4 is input, as indicated by a solid line in FIG. 12, it may be seen that the time TR21 (=t21−t20) from a timing (=t20) at which the word line voltage of the memory cell MC to be read starts to rise to a timing (=t21) at which the word line voltage reaches the voltage Vx is longer than the time when the step waveform PP is input.

Further, when the same ramp waveform is input to two memory cells MC having different effective word line lengths from the driver constituting the row decoder 40, that is, when the same ramp waveform is input to a small delay memory cell MC and a large delay memory cell MC, the voltage arrival time until the word line voltage of the memory cell MC reaches the same voltage Vx after the start of rise of the word line voltage differs. In this case, naturally, the time of the small delay memory cell MC becomes relatively shorter.

Meanwhile, when the step waveform PP is input to the large delay memory cell MC and the word line voltage starts to rise from timing t10, as indicated by a broken line in FIG. 12, the voltage arrival time of the large delay memory cell MC is time TR12 (>>TR11).

Further, when the ramp waveform R4 is input to the large delay memory cell MC and the word line voltage starts to rise from timing t20, as indicated by a broken line in FIG. 12, the voltage arrival time of the large delay memory cell MC is time TR22 (>TR21).

That is, the time until the word line voltage reaches the voltage Vx after the start of rise of the word line voltage differs according to the word line length.

Figure 13:
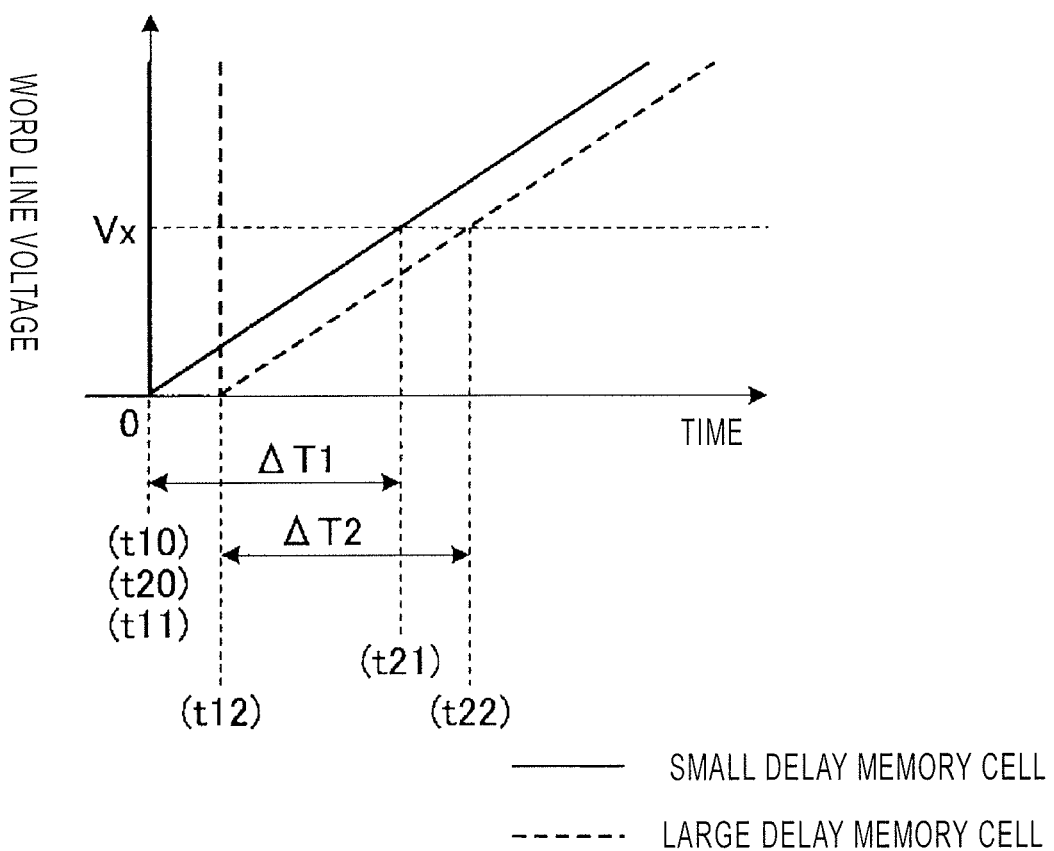
FIG. 13 is a diagram (part 2) for illustrating the principle of data read processing according to the second embodiment.

FIG. 13 is a diagram (part 2) for illustrating the principle of data read processing.

However, for the same memory cell MC, when a difference between the time from when the step waveform PP is input to when the word line voltage reaches the voltage Vx and the time from when the ramp waveform R4 is input to when the word line voltage reaches to the voltage Vx is obtained, the time difference turned out to be constant for either a small delay memory cell MC or a large delay memory cell MC.

That is, a time difference $\Delta T1$ obtained by subtracting time TR11 from time TR21 for a memory cell MC having a characteristic indicated by a solid line in FIG. 12 (small delay memory cell MC) and a time difference $\Delta T2$ obtained by subtracting time TR12 from time TR22 for a memory cell MC having a characteristic indicated by a broken line in FIG. 12 (large delay memory cell MC) are considered not to fluctuate significantly within a time period in which the ramp waveform is given twice. Therefore, it may be considered that the time difference $\Delta T1$ and the time difference $\Delta T2$ are equal to each other ($\Delta T1=\Delta T2$).

By the way, in the second embodiment as well, as in the first embodiment, when a threshold voltage (=corresponding word line voltage) corresponding to data programmed in the memory cell MC for obtaining the time differences $\Delta T1$ and $\Delta T2$ is high, the time differences $\Delta T1$ and $\Delta T2$ increase and becomes long. When the threshold voltage (=corresponding word line voltage) corresponding to the data programmed in the memory cell MC is low, the time differences $\Delta T1$ and $\Delta T2$ decrease and become short.

Accordingly, as in the first embodiment, when the relationship between the time differences $\Delta T1$ and $\Delta T2$ and the threshold voltage is grasped in advance for a semiconductor device to be determined, it may be seen that the threshold voltage may be determined using the time differences $\Delta T1$ and $\Delta T2$.

As described above, according to the second embodiment as well, in a semiconductor memory device (e.g., NAND flash memory) that performs multi-value storage such as TLC, QLC, etc., since the threshold voltage corresponding to the programmed data may be specified without waiting until the voltage of each memory cell is stabilized, it is possible to provide a semiconductor memory device capable of performing processing at a high speed by reducing the time required for reading or verifying.

In the above description, the input order of the waveforms is the step waveform PP→the ramp waveform R4, but the same result is obtained even when the input order is the ramp waveform R4→the step waveform PP (a waveform having a small slope→a waveform having a large slope).

[3] Third Embodiment

Next, a third embodiment will be described.

First, the principle of the third embodiment will be described.

As described above, there is a difference in delay time between a memory cell MC having a short effective word line length from the driver and a memory cell MC having a long effective word line length from the driver. However, this delay time difference may be ignored between adjacent bit lines since the delay time difference is small between the adjacent bit lines.

Therefore, in the third embodiment, in a semiconductor memory device that has a plurality of memory cells connected to a word line and reads data of the memory cells connected to the word line by applying a ramp signal of which voltage increases with a predetermined slope to the word line, the memory cells are grouped into a plurality of groups according to the execution length of the word line from the driver constituting the row decoder to the memory cell.

Then, for each group, a difference between the expected value of the threshold voltage of a memory cell belonging to the group and the actually detected threshold voltage of the memory cell is detected, and a reference threshold voltage for determining the threshold voltage corresponding to the data programmed in the memory cell based on this difference is shifted relative to the threshold voltage of the memory cell.

As a result, even when the delay of the word line voltage applied to each group gradually increases, the relationship between the threshold voltage of the memory cell MC and the reference threshold voltage may be kept substantially constant, and thus, the threshold voltage of the memory cell may be reliably determined.

Figure 14:
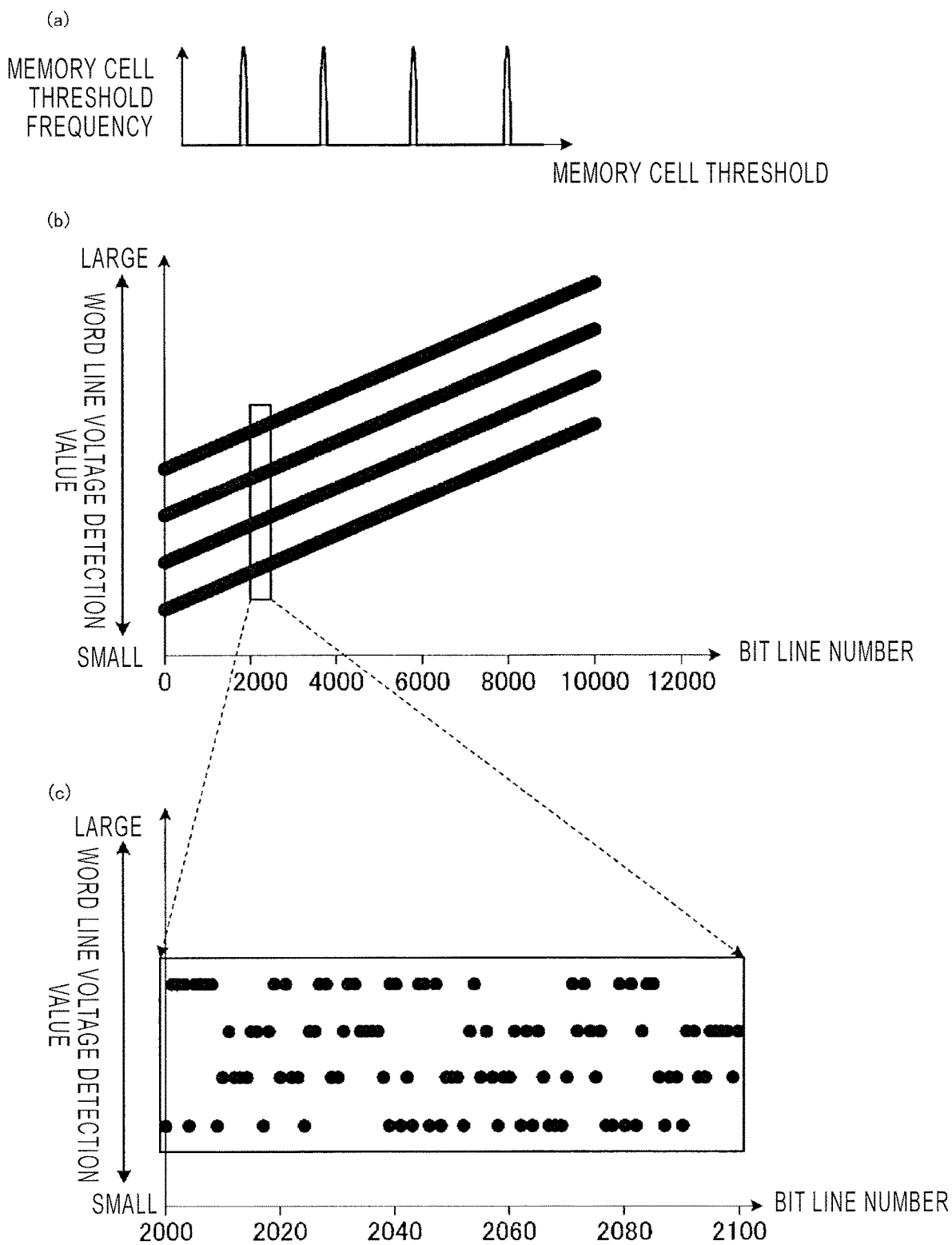
FIG. 14 is a diagram (part 1) for illustrating a principle according to a third embodiment.

FIG. 14 is a diagram (part 1) for illustrating the principle according to the third embodiment.

In FIG. 14, for the purpose of easy understanding, a case in which a Multi-Level Cell (MLC) is used as multi-value technology is illustrated as an example.

Here, (a) of FIG. 14 is a diagram illustrating the relationship between the threshold frequency of a memory cell MC and a threshold (voltage) corresponding to data programmed in the memory cell MC. The vertical axis represents the threshold frequency of the memory cell, and the horizontal axis represents the threshold (voltage) of the memory cell.

In FIG. 14, (b) and (c) are diagrams for illustrating the relationship between a word line voltage detection value when a current flows through the memory cell MC, and a bit line number to which the memory cell MC is connected (the larger the bit line number, the longer the length of the effective word line WL that reaches the memory cell MC). The vertical axis represents the word line voltage detection value, and the horizontal axis represents the bit line number. Here, the word line voltage detection value corresponds to a time from an application of a word line voltage having a ramp waveform to a certain word line WL to a change in a non-conduction/conduction state of each memory cell MC in a state where a plurality of memory cells MC connected to the word line WL may be affected by the propagation delay of the word line voltage. In other words, the word line voltage detection value corresponds to the threshold voltage of the memory cell virtually converted as an input terminal voltage of the word line.

As illustrated in (a) of FIG. 14, when the memory cell MC is a Multi-Level Cell (MLC), the frequency of the threshold voltage corresponding to the programmed data of the memory cell MC is classified into four states.

As illustrated in (b) of FIG. 14, looking at the entire bit line, it seems that the word line voltage detection value when a current flows through the memory cell MC gradually shifts higher as the bit line number increases and the effective word line length increases (as a distance from the driver to the memory cell MC increases). However, as illustrated in (c) of FIG. 14 in which a portion indicated by a bold frame in (b) of FIG. 14 is enlarged, it may be seen that there is almost no change between adjacent bit lines having a small difference in bit line number (between bit lines having a small word line length difference from the driver to the memory cell MC).

Figure 15:
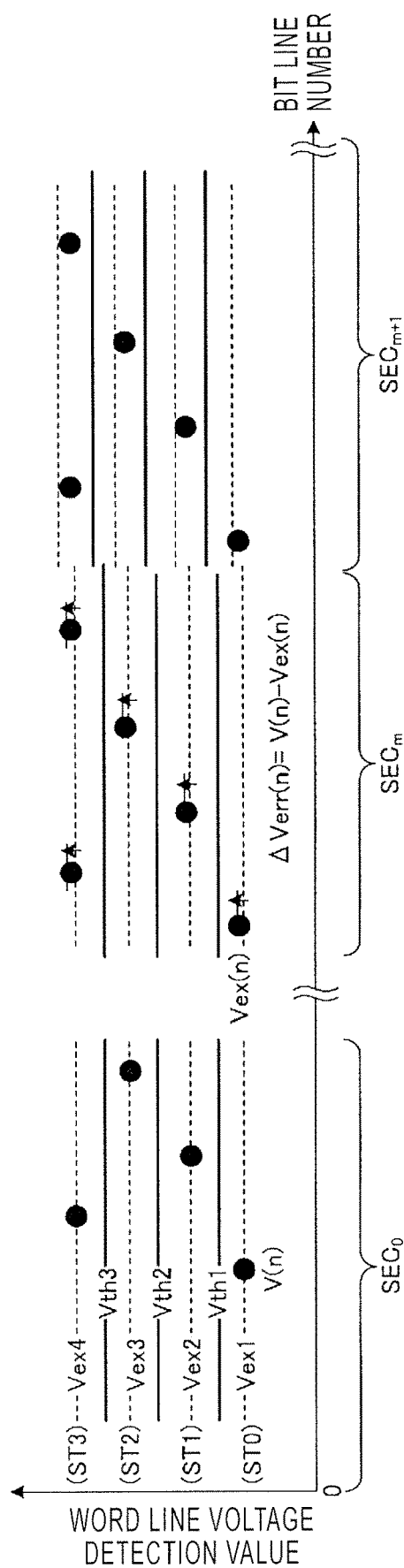
FIG. 15 is a diagram (part 2) for illustrating the principle according to the third embodiment.

FIG. 15 is a diagram (part 2) for illustrating the principle according to the third embodiment.

Therefore, as illustrated in FIG. 15, an effective word line length range that may be considered that the word line voltage detection value exceeding the threshold voltage in the memory cell MC in the same state does not change is divided into groups according to the bit line number of the memory cell as a predetermined section. For all the memory cells belonging to the predetermined section (all the memory cells belonging to the group), it may be seen that it is sufficient to determine a state to which each memory cell MC belongs by using the same reference threshold voltage.

Specifically, as indicated in an section SEC0 closest to the driver in FIG. 15, a reference threshold voltage for discriminating between the state ST0 and the state ST1 is denoted by Vth1, a reference threshold voltage for discriminating between the state ST1 and the state ST2 is denoted by Vth2, and a reference threshold voltage for discriminating between the state ST2 and the state ST3 is denoted by Vth3.

Further, in each memory cell MC belonging to the section SEC0, the expected detection value of the word line voltage of the memory cell MC corresponding to the state 0 is denoted by Vex1, the expected detection value of the word line voltage of the memory cell MC corresponding to the state 1 is denoted by Vex2, the expected detection value of the word line voltage of the memory cell MC corresponding to the state 2 is denoted by Vex3, and the expected detection value of the word line voltage of the memory cell MC corresponding to the state 3 is denoted by Vex4.

Here, the expected detection value of the word line voltage refers to a word line voltage value expected to be detected from the threshold frequency of the memory cells MC belonging to each state. Further, a word line voltage value actually detected in a certain memory cell MCn (n is a natural number) is denoted by V(n).

Then, in one memory cell MCn in a certain section SECm, an error Verr(n) is calculated as a difference between the actually detected word line voltage value V(n) and an expected detection value Vex(n) of the word line voltage of a memory cell MC corresponding to the states ST0 to ST3 determined to belong to the memory cell MCn.

Specifically, the error Verr(n) is calculated according to the expression of Verr(n)=V(n)−Vex(n).

When the average value of the errors Verr(n) in the section SECm exceeds a predetermined value, that is, when a difference between the actually detected word line voltage value V(n) and the expected detection value Vex(n) of the word line voltage in a plurality of memory cells MC belonging to the section SECm increases to some extent, the reference threshold voltages (Vth1 to Vth3 described above) and the expected detection values (Vex1 to Vex4 described above) in a section SECm+1 next to the section SECm are shifted to the higher side.

Specifically, for example, when the reference threshold voltages Vth1 to Vth3 and the expected detection values Vex1 to Vex4 are handled as digital data with a certain resolution, these voltages are increased by 1 LSB of the resolution.

As a result, since the reference threshold voltages Vth1 to Vth3 and the expected detection values Vex1 to Vex4 in the section SECm are updated to the reference threshold voltages Vth1 to Vth3 and the expected detection values Vex1 to Vex4 in the section SECm+1, it is possible to suppress erroneous determination on states.

In addition, since the reference threshold voltages Vth1 to Vth3 and the expected detection values Vex1 to Vex4 do not change suddenly, the process of shifting the reference threshold voltages Vth1 to Vth3 and the expected detection values Vex1 to Vex4 to the higher side does not need to be performed every time, and it is sufficient to perform the process from time to time with a predetermined set period.

Next, a specific process of the third embodiment will be described.

Figure 16:
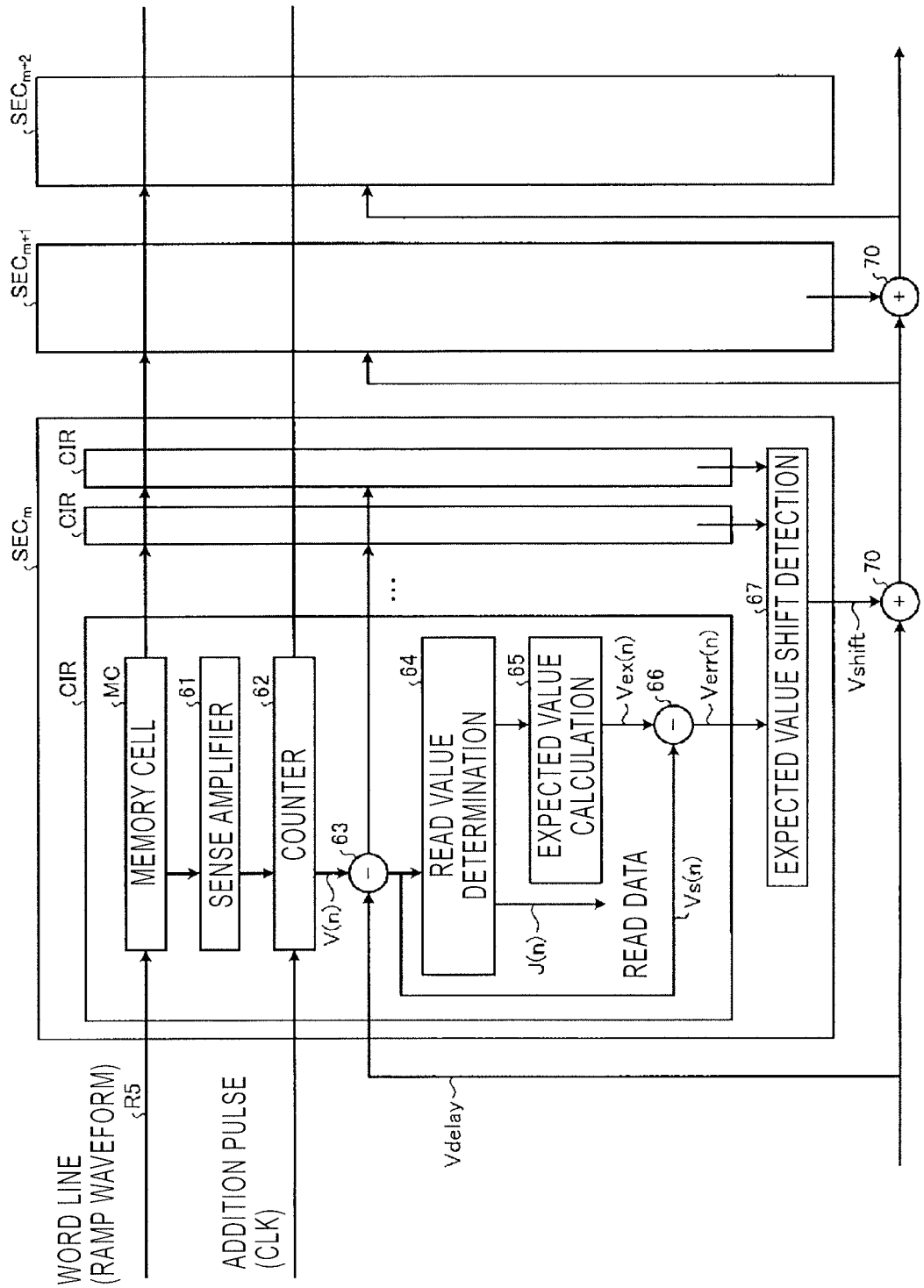
FIG. 16 is a functional configuration block diagram of a memory chip according to the third embodiment.

FIG. 16 is a functional configuration block diagram of a memory chip of the third embodiment.

FIG. 16 illustrates only the sections SECm, SECm+1, and SECm+2 for easy understanding and simplification of illustration.

The configuration in each section will be described using the section SECm as an example.

In the section SECm, a circuit CIR corresponding to each memory cell MC is formed by the number of memory cells MC (=the number of bit lines) belonging to the section SECm, and a word line to which a ramp waveform R5 is input is connected to each memory cell MC.

Here, it is assumed that all the circuits CIR are controlled by the chip control circuit 33 constituting the memory chip 30 illustrated in FIG. 2.

Each of the circuits CIR includes a sense amplifier 61 that detects a current flowing when a word line voltage is applied, and outputs a trigger signal trig, a counter 62 that receives an addition pulse CLK and outputs a count value at a timing when the trigger signal trig is output, a first subtractor 63 that outputs a corrected count value Vs(n) obtained by subtracting a predetermined delay subtraction value Vdelay corresponding to the effective word line length from the count value output by the counter 62, a read value determination circuit 64 that compares the corrected count value Vs(n) with a predetermined reference count value corresponding to each state to determine a read value of each memory cell, and outputs the determined read value as read data J(n), an expected value calculation circuit 65 that outputs an expected count value corresponding to one of the expected detection values Vex1 to Vex4 based on the read data J(n), and a second subtractor 66 that subtracts the expected count value from the corrected count value and outputs an expected value error count value corresponding to an expected value error ΔVerr. Each of these units 61 to 66 is configured as a circuit.

Further, the circuit CIR further includes an expected value shift detection circuit 67 that outputs a predetermined addition value to be added to a delay subtraction value in the section SECm+1 next to the section SECm when the expected value error ΔVerr corresponding to all the memory cells MC belonging to the section SECm is input to the section SECm and the average value of the expected value error count values exceeds a predetermined value, and an adder 70 that adds the predetermined addition value output from the corresponding expected value shift detection circuit 67 to the delay subtraction value Vdelay and outputs a delay subtraction value in the next section. For example, when the count value is digital data, the predetermined value may be a value corresponding to 0.5 LSB of the resolution. For example, when the count value is digital data, the predetermined addition value may be a value corresponding to 1 LSB of the resolution.

Next, the operation of the third embodiment will be described.

Figure 17A:
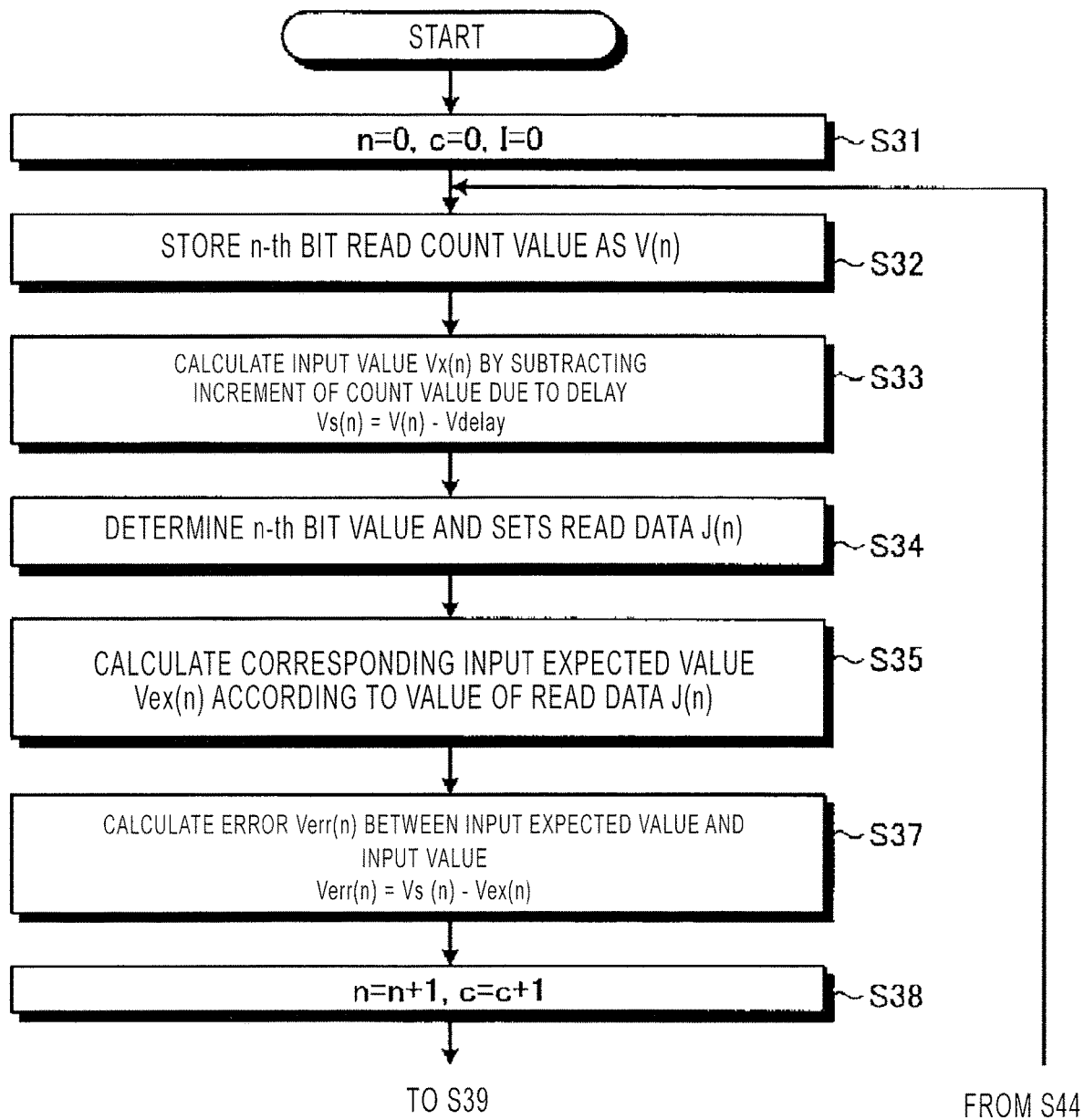
FIGS. 17A and 17B are flowcharts of a processing according to the third embodiment.
Figure 17B:
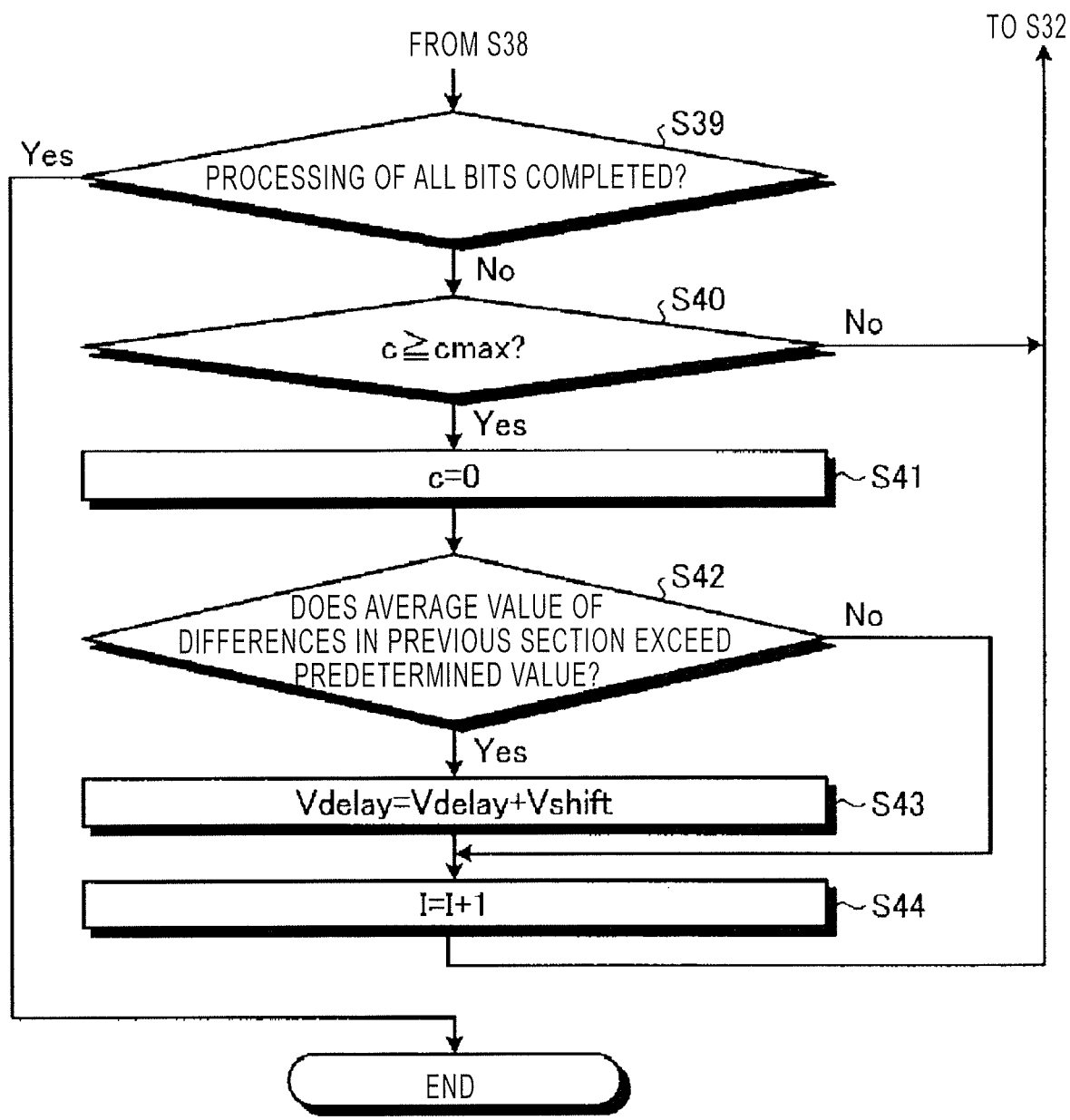

FIGS. 17A and 17B are flowcharts of a processing according to the third embodiment.

First, the chip control circuit 33 sets a count value n, a shift detection processing count value c, and a section count value I to 0 which is an initial value (S31).

Here, the count value n is a parameter for specifying a bit line to be read.

The shift detection processing count value c is a parameter for specifying a circuit CIR.

The section count value I is a parameter for specifying a section SEC to be processed.

Next, the chip control circuit 33 (see FIG. 2) stores a read value, which is a count value read from the counter 62 of the n-th bit line, as bit line read data V(n), in a memory (not illustrated) (S32).

Subsequently, the first subtractor 63 calculates an input value Vs(n) by subtracting the value Vdelay corresponding to the increment of the count value due to a delay caused by the word line length from the bit line read data V(n), and outputs the input value Vs(n) to the read value determination circuit 64 (S33).

Specifically, the first subtractor 63 calculates the input value Vs(n)=V(n)−Vdelay and outputs the input value to the read value determination circuit 64 and the second subtractor 66.

Next, the read value determination circuit 64 determines the input value Vs(n) that has been input, sets the corresponding read data J(n), and outputs the read data J(n) to the expected value calculation circuit 65 (S34).

Specifically, when it is determined that the input value Vs(n) is smaller than the first count threshold value Vth1, that is, Vs(n)<Vth1, the read value determination circuit 64 sets the read data J(n) to 0 and outputs the set read data J(n) to the expected value calculation circuit 65.

Similarly, when it is determined that the input value Vs(n) is equal to or larger than the first count threshold Vth1 and smaller than the second count threshold Vth2, that is, Vth1≤Vs(n)<Vth2, the read value determination circuit 64 sets the read data J(n) to 1 and outputs the set read data J(n) to the expected value calculation circuit 65.

In addition, when it is determined that the input value Vs(n) is equal to or larger than the second count threshold Vth2 and smaller than the third count threshold Vth3, that is, Vth2≤Vs(n)<Vth3, the read value determination circuit 64 sets the read data J(n) to 2 and outputs the set read data J(n) to the expected value calculation circuit 65.

Further, when it is determined that the input value Vs(n) is equal to or larger than the third count threshold Vth3, that is, Vth3≤Vs(n), the read value determination circuit 64 sets the read data J(n) to 3 and outputs the set read data J(n) to the expected value calculation circuit 65.

Next, the expected value calculation circuit 65 calculates an expected detection value Vex(n) (S35).

Here, the expected detection value Vex(n) is a value of the read data J(n), that is, a value (predicted value) expected as the input value Vs(n) in a state to which the corresponding memory cell MC belongs.

Next, the second subtractor 66 calculates an error Verr(n) between the expected detection value Vex(n) and the input value Vs(n) and outputs the error Verr(n) to the expected value shift detection circuit 67 (S37).

Specifically, the second subtractor 66 calculates Verr(n)=Vex(n)−Vs(n).

Next, the expected value shift detection circuit 67 performs counting up by adding 1 to each of the count value n and the shift detection processing count value c of the bit line number (S38).

Specifically, n=n+1 and c=c+1.

Next, the expected value shift detection circuit 67 determines whether or not the count value n of the bit line number exceeds a value n max corresponding to the total number of bit lines belonging to each section SEC, that is, whether or not the processing of all the bit lines has been completed (S39).

When it is determined in step S39 that the count value n of the bit line number exceeds the value n max corresponding to the total number of bit lines belonging to each section SEC (Yes in S39), the expected value shift detection circuit 67 ends the process.

When it is determined in step S39 that the count value n of the bit line number is equal to or smaller than the value n max corresponding to the total number of bit lines belonging to each section SEC (No in S39), the expected value shift detection circuit 67 determines whether or not the shift detection processing count value c is equal to or larger than a value c max corresponding to the number of sections SEC (S40).

When it is determined in step S40 that the shift detection processing count value c is still smaller than the value c max corresponding to the number of sections SEC, the expected value shift detection circuit 67 moves the process to step S32 again to repeat the same process as described above.

When it is determined in step S40 that the shift detection processing count value c is equal to or larger than the value c max corresponding to the number of sections SEC, the expected value shift detection circuit 67 resets the shift detection processing count value c to 0 (S41).

Subsequently, the chip control circuit 33 determines whether or not the average value of the error Verr(n) in the previous section exceeds a predetermined value kth according to the following equation (S42).

[Equation 1]

$$\frac{\sum_{n=l \times cmax}^{n=(l+1) \times cmax} Verr(n)}{cmax} > kth \qquad (1)$$

When it is determined in step S42 that the average value of the error Verr(n) of the previous section exceeds the predetermined value kth (Yes in S42), the chip control circuit 33 adds a shift amount Vshift to the count value increase amount Vdelay due to a delay caused by the word line length (S43).

That is, Vdelay=Vdelay+Vshift.

Next, the chip control circuit 33 performs counting up by adding 1 to the section count value l, that is, l=l+1.

Next, the process proceeds to step S32 to repeat the above-described process.

With the above-described process, according to the third embodiment, even when the input value Vs(n), which is a detected value, changes due to a difference in effective word line length from the driver to the memory cell, it is possible to secure an effective difference from the threshold of the memory cell MC in a large and constant amount, and it is possible to more reliably determine to which state the threshold voltage of the memory cell belongs.

Figure 18:
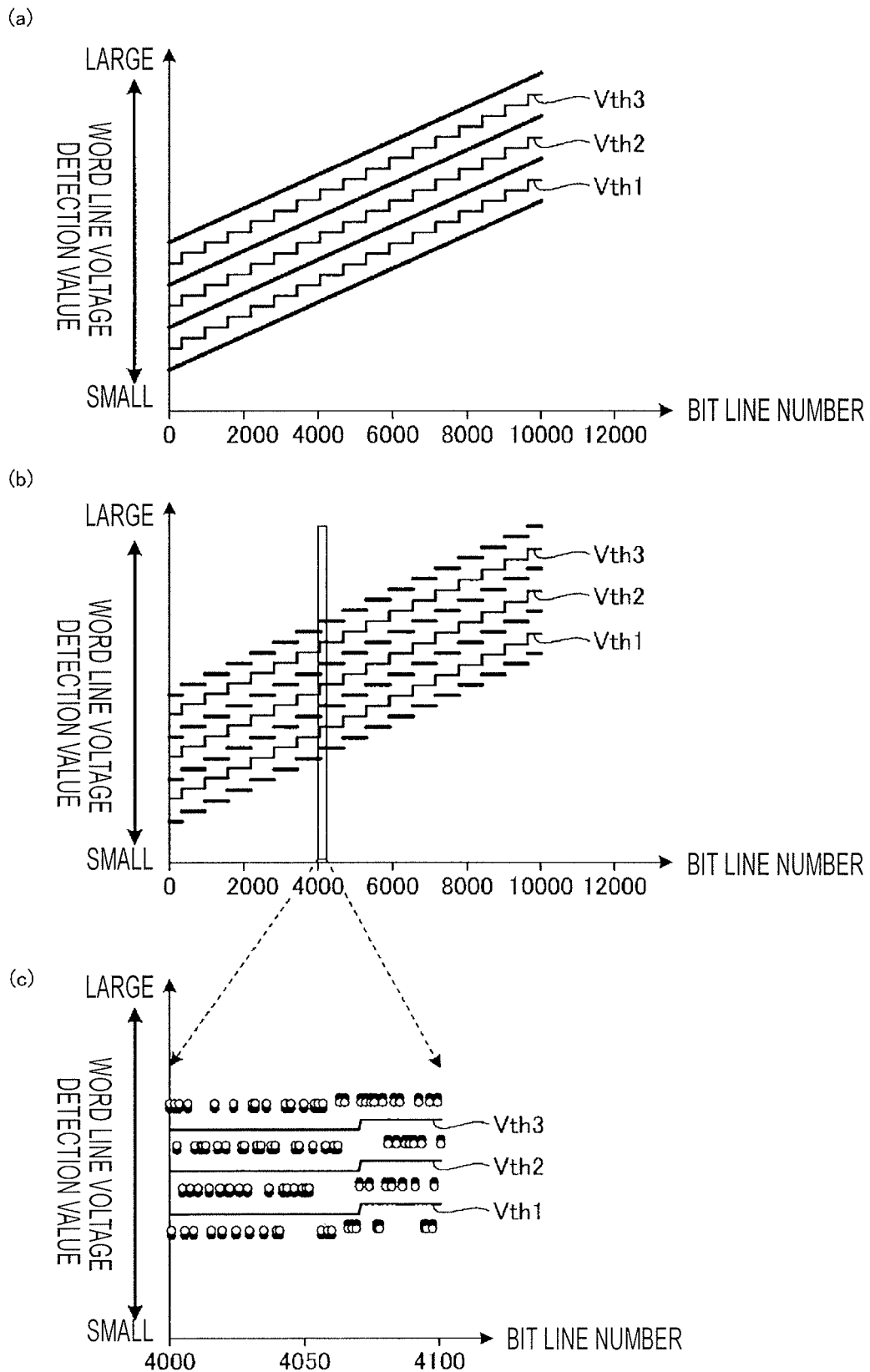
FIG. 18 is an explanatory diagram (part 1) of an effect according to the third embodiment.

FIG. 18 is an explanatory diagram (part 1) of an effect according to the third embodiment.

FIG. 18 illustrates a case where noise of a threshold voltage is small and an ideal input value Vs(n) is obtained. In FIG. 18, (a) is an explanatory diagram of the relationship between a measured word line voltage detection value and the threshold voltage. In FIG. 18, (b) is an explanatory diagram of the relationship between a quantized measured word line voltage detection value and the threshold voltage. In FIG. 18, (c) is an enlarged diagram of a portion of a bold frame in (b) of FIG. 18.

Even when the process of the third embodiment for shifting the expected value of the input value Vs(n) of the memory cell MC is not performed, as illustrated in (a) of FIG. 18, when a word line voltage applied to a word line has a ramp waveform with a predetermined slope, the determination threshold values Vth3, Vth2, and Vth1, which are threshold voltages, need to be gradually increased stepwise.

A voltage difference between the input value Vs(n) indicated by a bold line, which is an actual measurement value, and each of the determination threshold values Vth3, Vth2, and Vth1 varies depending on the bit line number, and a voltage difference with respect to the input value Vs(n) periodically decreases or increases. However, since the relationship of voltage level does not change, even when the input value Vs(n), which is a detection value, changes due to the difference in effective word line length from the driver to the memory cell, it may be determined to which state the threshold of the memory cell MC belongs.

Meanwhile, when the process of the third embodiment is performed, as illustrated in (b) of FIG. 18, variations in voltage difference according to the bit line number between the input value Vs(n) indicated by a bold line and each of the determination threshold values Vth3, Vth2, and Vth1 are reduced. That is, as illustrated in (c) of FIG. 18, a voltage difference with respect to the input value Vs(n) may be kept substantially constant, and, even when the input value Vs(n), which is a detection value, changes due to the difference in effective word line length from the driver to the memory cell, it may be more reliably determined to which state the threshold of the memory cell MC belongs.

Figure 19:
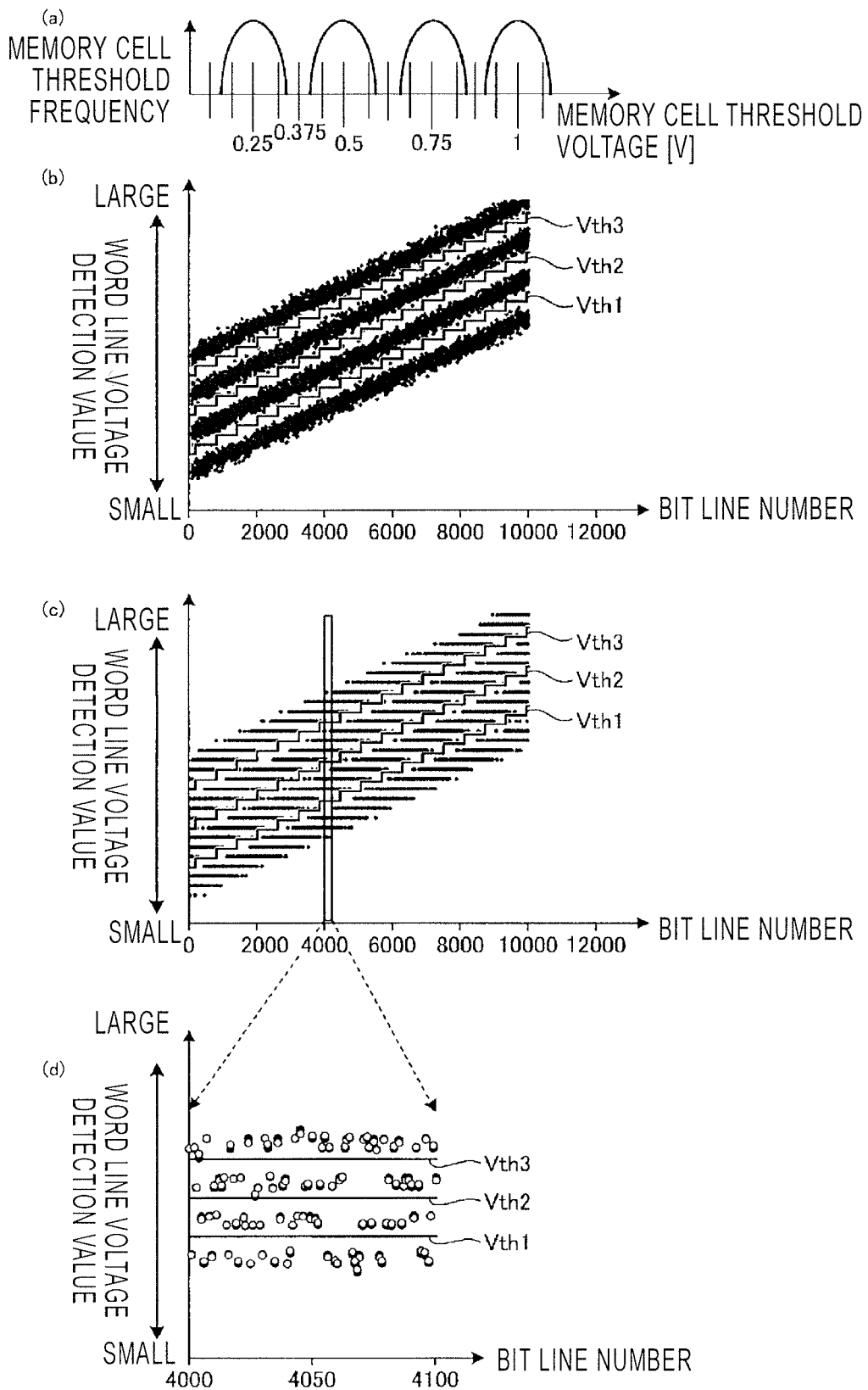
FIG. 19 is an explanatory diagram (part 2) of an effect according to the third embodiment.

FIG. 19 is an explanatory diagram (part 2) of the effect according to the third embodiment.

FIG. 19 illustrates the state of the input value Vs(n) when the standard deviation of a threshold voltage distribution of a memory cell with respect to the determination threshold voltage difference/each write value is 4. In FIG. 19, (a) is a diagram for illustrating the relationship between the threshold frequency of the memory cell and the threshold voltage of the memory cell when the standard deviation of the threshold voltage distribution of the memory cell is 4. In FIG. 19, (b) is an explanatory diagram of the relationship between a measured word line voltage detection value and the threshold voltage. In FIG. 19, (c) is an explanatory diagram of the relationship between a quantized measured word line voltage detection value and the threshold voltage. In FIG. 19, (d) is an enlarged diagram of a portion of a bold frame in (c) of FIG. 19.

As illustrated in (a) of FIG. 19, when noise of the threshold voltage increases, the threshold frequency of the memory cell approaches between adjacent states. Therefore, when the process of the third embodiment is not performed, as illustrated in (b) of FIG. 19, a voltage difference between the input value Vs(n), which is an actual measurement value, and each of the determination threshold values Vth3, Vth2, and Vth1, which are threshold voltages, is smaller than the ideal case illustrated in FIG. 18 due to noise, and when the input value Vs(n), which is a detection value, changes due to the difference in effective word line length from the driver to the memory cell, it is not easy to determine to which state the threshold of the memory cell MC belongs.

However, when the process of the third embodiment is performed, as illustrated in (c) of FIG. 19, variations in voltage difference according to the bit line number between the input value Vs(n) and each of the determination threshold values Vth3, Vth2, and Vth1 are reduced. In addition, as illustrated in (d) of FIG. 19 which is a partially enlarged diagram of the bold frame in (c) of FIG. 19, a voltage difference with respect to the input value Vs(n) may be almost certainly within a voltage range corresponding to each state. Therefore, even when the input value Vs(n), which is a detection value, changes due to the difference in effective word line length from the driver to the memory cell, it may be almost certainly determined to which state the threshold of the memory cell MC belongs.

Figure 20:
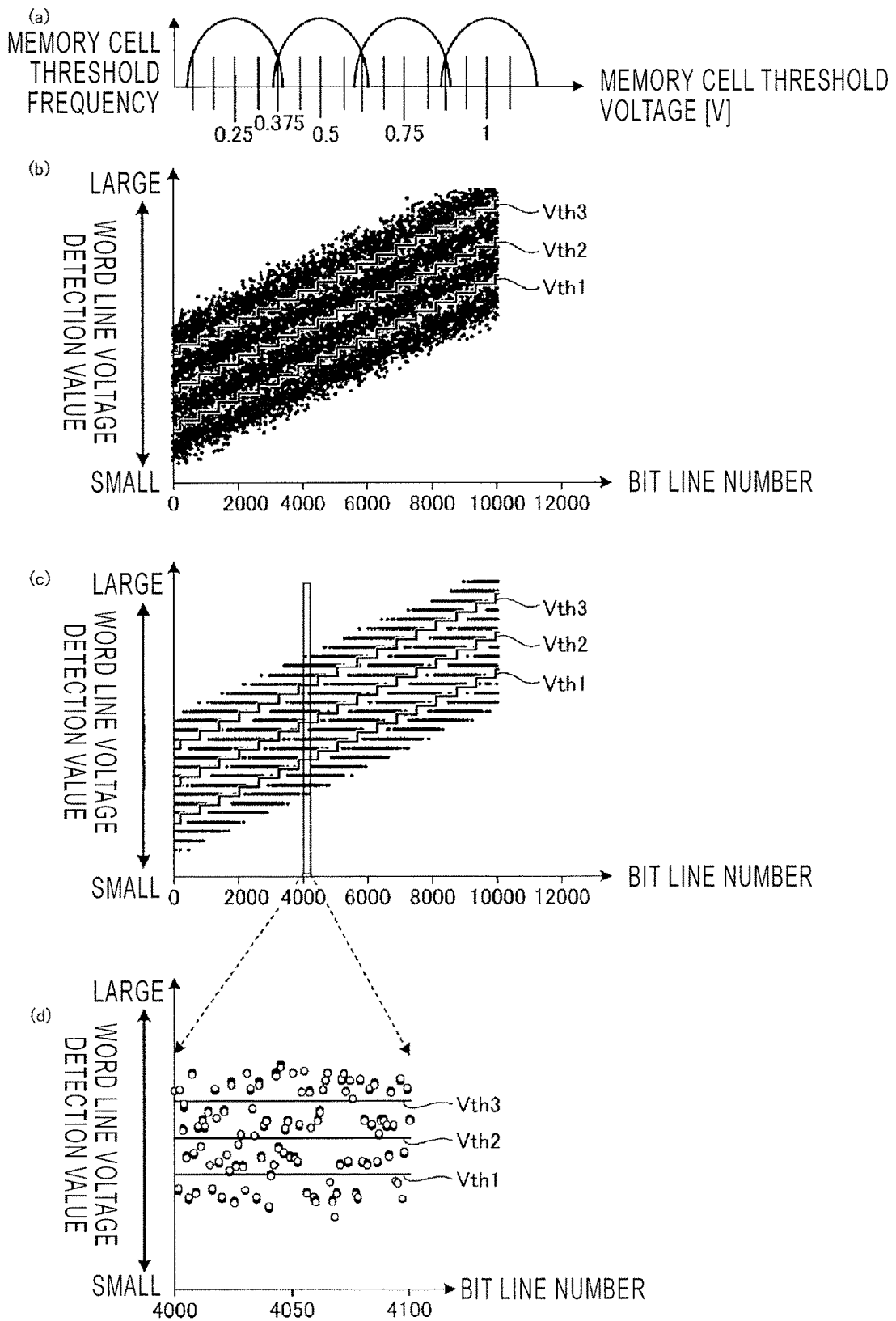
FIG. 20 is an explanatory diagram (part 3) of an effect according to the third embodiment.

FIG. 20 is an explanatory diagram (part 3) of the effect according to the third embodiment.

FIG. 20 illustrates the state of the input value Vs(n) when the standard deviation of a threshold voltage distribution of a memory cell with respect to the threshold voltage difference/each write value is 2. In FIG. 20, (a) is a diagram for illustrating the relationship between the threshold frequency of the memory cell and the threshold voltage of the memory cell when the standard deviation of the threshold voltage distribution of the memory cell is 2. In FIG. 20, (b) is an explanatory diagram of the relationship between a measured word line voltage detection value and the threshold voltage. In FIG. 20, (c) is an explanatory diagram of the relationship between a quantized measured word line voltage detection value and the threshold voltage. In FIG. 20, (d) is an enlarged diagram of a portion of a bold frame in (c) of FIG. 20.

As illustrated in (a) of FIG. 20, when noise of the threshold voltage further increases, the threshold frequency of the memory cell overlaps between adjacent states. Therefore, when the process of the third embodiment is not performed, as illustrated in (b) of FIG. 20, a voltage difference between the input value Vs(n) and each of the determination threshold values Vth3, Vth2, and Vth1 is smaller than the case illustrated in FIG. 19 due to noise, and when the input value Vs(n), which is a detection value, changes due to the difference in effective word line length from the driver to the memory cell, since the threshold of the memory cell MC reaches a voltage region corresponding to the other states, a correct state determination may not be performed.

However, when the process of the third embodiment is performed, as illustrated in (c) of FIG. 20, variations in voltage difference according to the bit line number between the input value Vs(n) and each of the determination threshold values Vth3, Vth2, and Vth1 are reduced. In addition, as illustrated in (d) of FIG. 20 which is a partially enlarged view of the bold frame in (b) of FIG. 20, a voltage difference with respect to the input value Vs(n) is within a voltage range corresponding to each state and the possibility of being determined as a state other than the state that should be determined is reduced. Therefore, even when the input value Vs(n), which is a detection value, changes due to the difference in effective word line length from the driver to the memory cell, it may be almost certainly determined to which state the threshold of the memory cell MC belongs.

As described above, according to the third embodiment, a ramp waveform is input to a word line, and voltage fluctuation caused by fluctuation in the word line execution length from the driver to each memory cell is reliably suppressed to facilitate the determination of the threshold voltage read for each memory cell, so that, data may be read quickly and reliably.

[4] Modification of Embodiment

In the above description, the counter 51, the divider 52, and the digital/analog converter (DAC) 53 are used to output the first ramp waveform R1, the second ramp waveform R2 or the step waveform PP. However, an analog voltage generation circuit that generates the first ramp waveform R1, the second ramp waveform R2 or the step waveform PP may be provided.

In the above description, as an example, the counter starts counting up from the timing of start of voltage application to the word line and outputs a count value corresponding to the threshold voltage corresponding to the data programmed in the memory cell. However, a counter that starts counting down from the timing of start of voltage application to the word line and outputs a count value corresponding to the threshold voltage corresponding to the data programmed in the memory cell may be provided. In this case, the smaller the count value, the more the memory cell MC having a relatively higher threshold voltage is processed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells connected to a word line;
   a circuit configured to apply a voltage to the word line;
   a detection circuit configured to detect a first time difference from when a first signal of which a voltage is increased with a first single slope is applied to the word line to when a current flows through the memory cells in response to applying the first signal, and a second time difference from when a second signal of which a voltage is increased with a second single slope is applied to the word line to when a current flows through the memory cells in response to applying the second signal, the second slope being different from the first slope; and
   a determination circuit configured to determine a threshold voltage of the memory cells based on a difference between the first time difference and the second time difference.

2. The semiconductor memory device according to claim 1, wherein each of the first signal and the second signal is a ramp signal.

3. The semiconductor memory device according to claim 1, wherein the first signal is a pulse signal and the second signal is a ramp signal.

4. The semiconductor memory device according to claim 1, further comprising:
   a counter configured to:
      start counting when a voltage starts to be applied to the word line; and
      output a count value;
   a division circuit configured to output a division value obtained by dividing the count value by a value corresponding to a slope with which the voltage is increased; and
   a digital/analog conversion circuit configured to perform digital/analog conversion of the division value and output the digital/analog-converted division value as the first signal or the second signal.

5. The semiconductor memory device according to claim 1, further comprising: an analog voltage generation circuit configured to generate an analog signal including the first signal or the second signal.

6. A semiconductor memory device comprising:
   a word line;
   a circuit configured to apply a ramp signal to the word line, the ramp signal including a voltage that increases based on a predetermined slope;
   a plurality of memory cells connected to the word line, wherein the memory cells are grouped into a plurality of groups based on a respective length of the word line from the circuit to each of the memory cells;
   a calculation circuit configured to calculate, for each of the groups, a difference between an expected value of a threshold voltage corresponding to data stored in a memory cell belonging to each of the groups and a detected threshold voltage of the memory cell;
   a shift circuit configured to shift, for each of the groups, a determination voltage for determining the threshold voltage corresponding to the data stored in the memory cell based on the calculated difference
   a counter configured to output a first count value starting to be counted when the ramp signal is applied to the word line,
   wherein the calculation circuit is configured to use the first count value counted by the counter until a current flows through the memory cell after applying the ramp signal as a detected threshold voltage for the memory cell, and calculate a count value difference between the expected value of the threshold voltage and the first count value, and
   the shift circuit configured to shift the determination voltage to a second count value based on the calculated count value difference.

7. The semiconductor memory device according to claim 6, wherein the shift circuit is further configured to shift the determination voltage to the second count value when the count value difference exceeds a predetermined value.

8. A method of operating a semiconductor memory device including a plurality of memory cells connected to a word line, comprising:
   applying a voltage to the word line;
   detecting a first time difference from when a first signal that increases with a first single slope is applied to the word line to when a current flows through the memory cells in response to applying the first signal, and a second time difference from when a second signal that increases with a second single slope is applied to the word line to when a current flows through the memory cells in response to applying the second signal, the second slope being different from the first slope; and determining a threshold voltage of the memory cells based on a difference between the first time difference and the second time difference.

9. The method according to claim 8, wherein each of the first signal and the second signal is a ramp signal.

10. The method according to claim 8, wherein the first signal is a pulse signal and the second signal is a ramp signal.

11. The method according to claim 8, further comprising:

starting counting when a voltage starts to be applied to the word line;

outputting a division value obtained by dividing a count value by a value corresponding to a slope with which the voltage is increased; and performing digital/analog conversion of the division value and outputting the digital/analog-converted division value as the first signal or the second signal.

12. The method according to claim 8, further comprising: generating an analog signal including the first signal or the second signal.

13. A method of operating a semiconductor memory device including a plurality of memory cells connected to a word line, the plurality of memory cells being grouped into a plurality of groups based on a respective length of the word line from a circuit configured to apply a ramp signal to the word line to each of the memory cells, the method comprising:

applying the ramp signal to the word line, the ramp signal including a voltage increasing with a predetermined slope;

calculating, for each of the groups, a difference between an expected value of a threshold voltage corresponding to data stored in a memory cell belonging to each of the plurality of groups and a detected threshold voltage of the memory cell;

shifting, for each of the groups, a determination voltage for determining the threshold voltage corresponding to the data stored in the memory cell based on the calculated difference;

outputting a first count value starting to be counted when the ramp signal is applied to the word line, using the first count value counted until a current flows through the memory cell after applying the ramp signal as a detected threshold voltage for the memory cell, calculating a count value difference between the expected value of the threshold voltage and the first count value, and shifting the determination voltage to a second count value based on the calculated count value difference.

14. The method according to claim 13, further comprising: shifting the determination voltage to the second count value when the count value difference exceeds a predetermined value.

* * * * *